United States Patent
Shibata

(10) Patent No.: US 7,129,110 B1
(45) Date of Patent: Oct. 31, 2006

(54) SEMICONDUCTOR DEVICE AND METHOD FOR MANUFACTURING THE SAME

(75) Inventor: Kazutaka Shibata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 107 days.

(21) Appl. No.: 09/830,092

(22) PCT Filed: Aug. 22, 2000

(86) PCT No.: PCT/JP00/05596

§ 371 (c)(1),
(2), (4) Date: Jun. 27, 2001

(87) PCT Pub. No.: WO01/15223

PCT Pub. Date: Jan. 3, 2001

(30) Foreign Application Priority Data

| Aug. 23, 1999 | (JP) | ................................ | 11/235619 |
| Aug. 23, 1999 | (JP) | ................................ | 11/235620 |
| Sep. 10, 1999 | (JP) | ................................ | 11/257589 |
| Oct. 14, 1999 | (JP) | ................................ | 11/292703 |

(51) Int. Cl.
*H01L 21/00* (2006.01)

(52) U.S. Cl. ................... 438/106; 108/109; 108/113; 108/459; 108/465; 108/613

(58) Field of Classification Search ............... 257/737, 257/777, 778; 438/108, 109, 113, 459, 465, 438/613, 106
See application file for complete search history.

(56) References Cited

U.S. PATENT DOCUMENTS

| 4,939,568 A | * | 7/1990 | Kato et al. ................... 257/686 |
| 5,229,647 A | * | 7/1993 | Gnadinger ................... 257/785 |
| 5,270,261 A | * | 12/1993 | Bertin et al. ................ 438/109 |
| 5,898,223 A | * | 4/1999 | Frye et al. ................... 257/777 |
| 5,977,640 A | | 11/1999 | Bertin et al. |
| 6,353,267 B1 | * | 3/2002 | Ohuchi et al. .............. 257/787 |
| 6,369,448 B1 | * | 4/2002 | McCormick ................ 257/777 |
| 6,391,685 B1 | * | 5/2002 | Hikita et al. ................ 438/113 |
| 6,424,034 B1 | * | 7/2002 | Ahn et al. ................... 257/777 |
| 6,455,353 B1 | * | 9/2002 | Lin ............................ 438/113 |
| 6,455,920 B1 | * | 9/2002 | Fukasawa et al. .......... 257/620 |
| 6,476,501 B1 | * | 11/2002 | Ohuchi et al. .............. 257/778 |
| 6,495,914 B1 | * | 12/2002 | Sekine et al. ............... 257/723 |

FOREIGN PATENT DOCUMENTS

| JP | 59092536 A | * | 5/1984 |
| JP | 02031437 A | * | 2/1990 |
| JP | 2-153527 | | 6/1990 |

(Continued)

OTHER PUBLICATIONS

Patent Abstracts of Japan. English Abstract and English Computer Translation of JP 08-236692 (1996).*

(Continued)

*Primary Examiner*—Yogendra N. Gupta
*Assistant Examiner*—Matthew J. Song
(74) *Attorney, Agent, or Firm*—Rabin & Berdo P.C.

(57) ABSTRACT

A method for manufacturing a semiconductor device having projection electrodes on the surface of a semiconductor substrate. This method include an electrode forming step of forming the projection electrodes on the surface of the semiconductor substrate, a step of forming a protective resin layer on the whole surface of the semiconductor substrate provided with the projection electrodes, a back side grinding step of thinning the semiconductor substrate by polishing or grinding the back side of the semiconductor substrate, and a surface grinding step of exposing the projection electrodes by polishing or grinding the surface side of the semiconductor substrate.

11 Claims, 14 Drawing Sheets

FOREIGN PATENT DOCUMENTS

| | | | |
|---|---|---|---|
| JP | 3-101128 A | * | 4/1991 |
| JP | 5-3183 | | 1/1993 |
| JP | 5-55278 | | 3/1993 |
| JP | 06151701 A | * | 5/1994 |
| JP | 8-236692 | | 9/1996 |
| JP | 11-150090 | | 6/1999 |
| JP | 11-288977 | | 10/1999 |
| JP | 2000-156461 | | 6/2000 |
| WO | WO 9909595 A1 | * | 2/1999 |

OTHER PUBLICATIONS

Patent Abstracts of Japan. English Abstract of JP 02-031437 (1990).*

Patent Abstract of Japan. English Abstract of JP 59-0925396 (1984).*

Patent Abstracts of Japan. English Abstract of JP 06-151701A (1994).*

Olsen et al. "Calculated stresses in multilayered heteroepitaxial structures", Journal of Applied Physics, vol. 48, No. 6, Jun. 1977.*

* cited by examiner

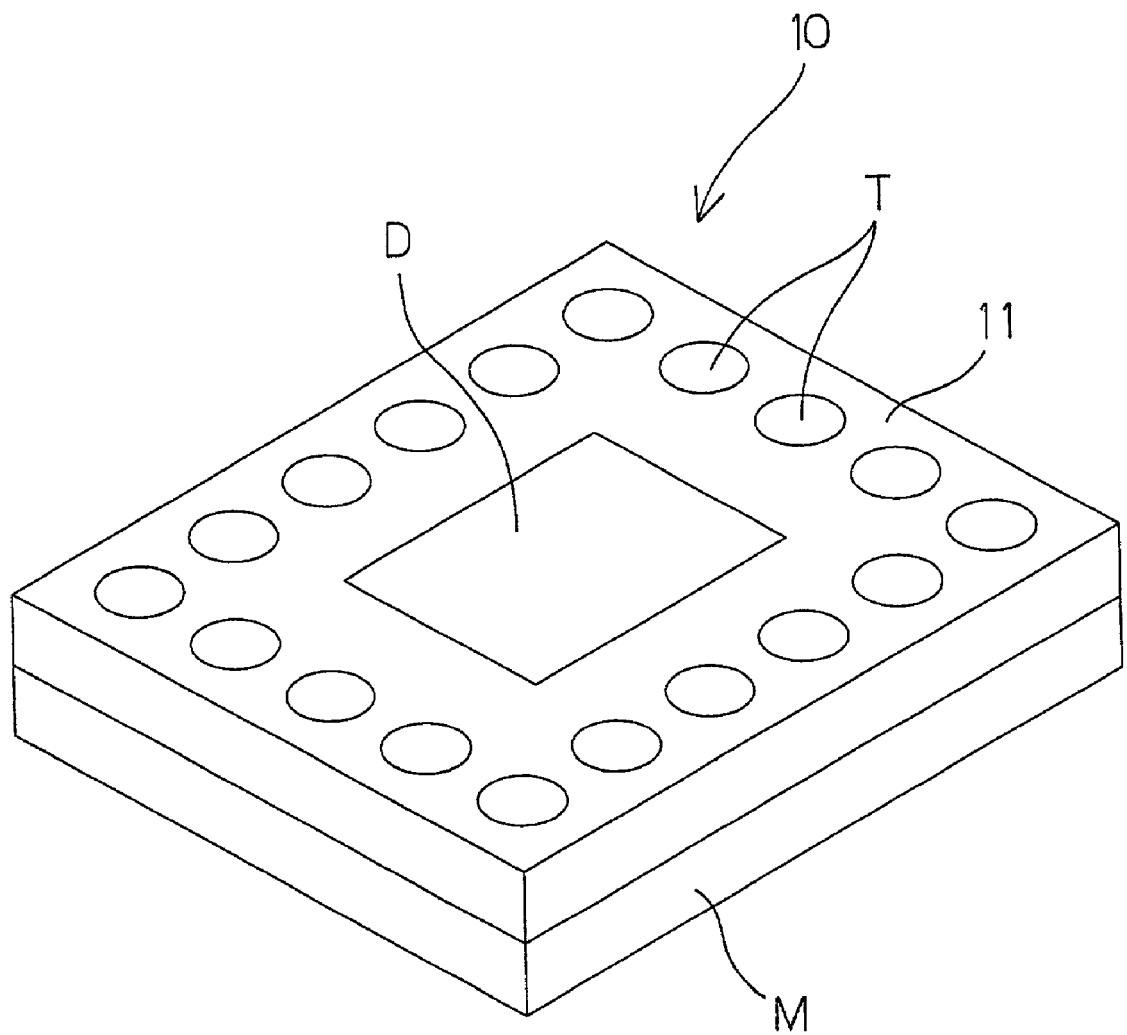

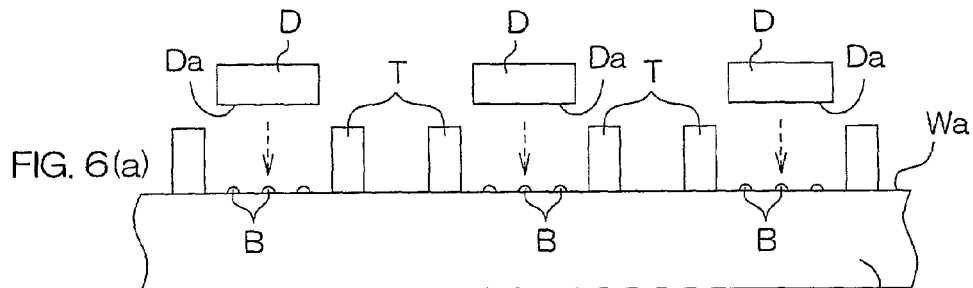
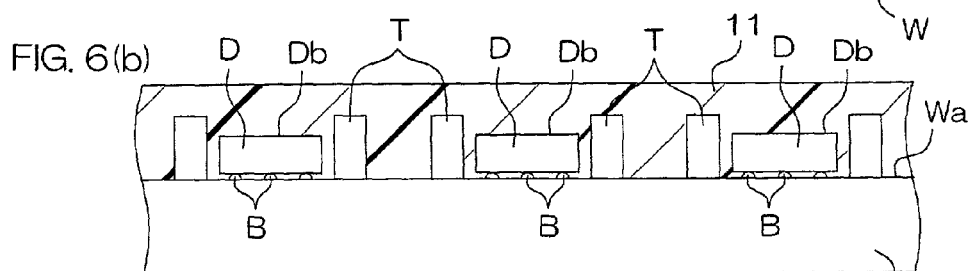
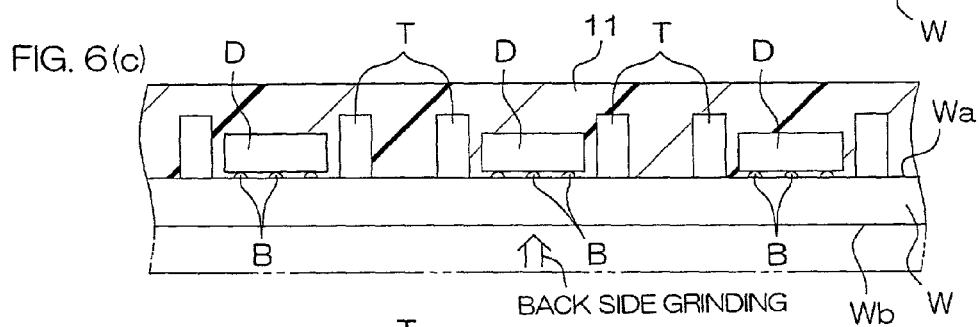
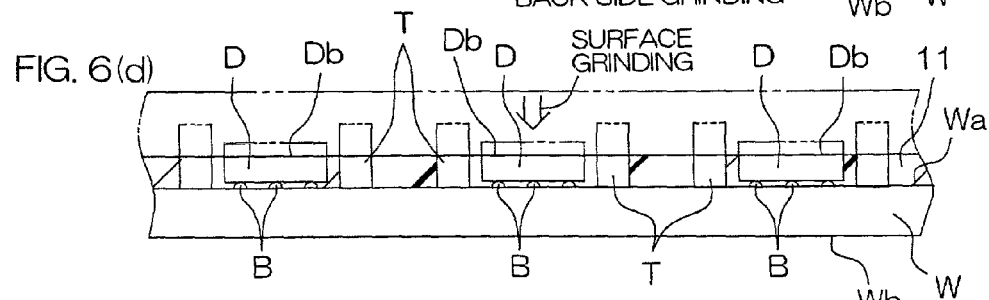
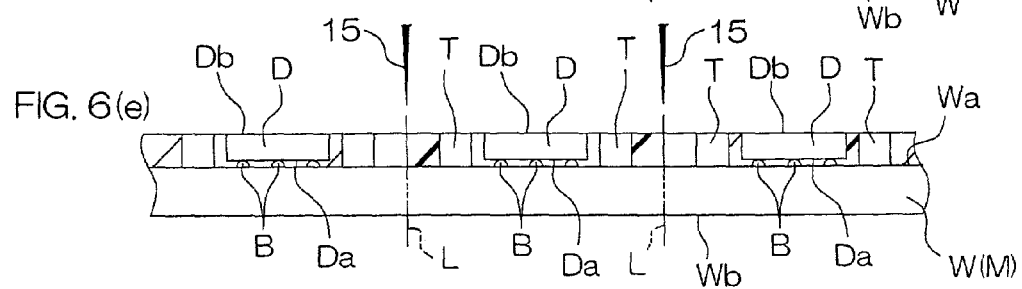

SEMICONDUCTOR DEVICE AND METHOD FOR MANUFACTURING THE SAME

BACKGROUND OF THE INVENTION

1. Field of the Invention

The present invention relates to a method for manufacturing a thin-type semiconductor device. Further, the present invention relates to a semiconductor device having a structure in which a semiconductor chip is bonded onto the surface of a solid device (for example, a wiring substrate or another semiconductor chip), and a method for manufacturing the same.

Further, the present invention relates to a semiconductor device which is advantageous to be three-dimensionally packaged and a method for manufacturing the same.

2. Background Art

A back side grinding step for grinding the back side of a semiconductor wafer (hereinafter referred to simply as wafer) in order to thin a semiconductor chip has been conventionally performed. The back side grinding step has been generally performed by adhering a soft protective film onto the surface of a wafer, then urging the wafer against a grinder through the protective film, and rotating the wafer in this state.

However, in a cutting out step for cutting individual semiconductor chips out of the wafer, the wafer is handled by a robot. Further, in a step for mounting each cut-out semiconductor chip on a lead frame, the semiconductor chip is handled by a robot. Therefore, excessive pursuit of thinning of a semiconductor chip causes the wafer or the semiconductor chip to be broken, so that the yield rate is reduced. Especially nowadays, since wafers become large-diametered, wafers thinned by the back side grinding treatment are apt to be broken.

In order to solve these problems, for example, in the Japanese Unexamined Patent Publication (KOKAI) No. 11-150090 (1999), it is proposed that after forming a group of projection electrodes on the surface of a wafer, a resin layer is formed on this surface of the wafer to use the resin layer as a protective and reinforcing plate. According to the method of manufacturing a semiconductor device disclosed in this Publication, after forming a resin layer, the back side of a wafer is ground, and further, the surface layer section of the resin layer is removed by etching. Thereby, the projection electrodes are exposed. Thereafter, the resin layer is removed along a scribed line, and further, a nitride layer as a protective layer is formed in the region avoiding the projection electrodes. Then, the wafer is cut along scribed lines to cut out individual semiconductor chips.

According to this method, a wafer, after its back side being ground, is reinforced by a resin layer, and each semiconductor chip is reinforced by the resin layer. And in each semiconductor chip, the projection electrodes functioning as external connection electrodes are embedded in the resin layer. Thereby, the wafer and the semiconductor chip can be satisfactorily handled without being broken, and at the same time, the semiconductor device can be remarkably thinned in comparison with a structure in which outer terminals are pulled out by wire-bonding or the like.

However, it is necessary to perform etching in order to expose the projection electrodes. At the time of etching, etching conditions must be determined so as to surely expose all of the projection electrodes, and therefore, the etching step is complicated and takes much time.

Furthermore, according to the above-mentioned manufacturing method of the prior art, there is a problem that a wafer is warped because of the differences between the thermal expansion/contraction coefficients of the wafer and the resin layer during the time after forming the resin layer on the wafer and before grinding the back side of the wafer. Such a warped wafer is exaggeratedly shown in FIG. 18. When such a warped wafer is ground by a flat grinder, the wafer after being ground has different thicknesses at the central region and the peripheral region thereof respectively. Consequently, semiconductor chips each having a uniform thickness cannot be obtained and in addition, sometimes a semiconductor chip cut out of the central region of the wafer may not be thinned to a desired thickness.

On the other hand, one of structures capable of heightening the substantial integration density of a semiconductor device is a chip-on-chip structure. In a semiconductor device having a chip-on-chip structure, for example, as shown in FIG. 19, a secondary chip 102 is bonded face-down onto the surface of a primary chip 101, and external connection electrodes 103 are provided on the back side of the primary chip 101. Such a chip-on-chip structure is advantageous to obtain a high integration density of the elements. However, in addition to the thicknesses a, b of the primary chip 101 and the secondary chip 102, the height c of the external connection electrodes is required. Therefore, it is a defect that the whole height (a+b+c) becomes relatively high.

Further, it is proposed that the space occupied by a semiconductor device is reduced by thinning a semiconductor package and three-dimensionally packaging or mounting the same.

FIG. 20 is a sectional view showing an example of a structure of a semiconductor device 70 proposed for the above-mentioned purpose. In the semiconductor device 70, a thin semiconductor chip 72 is disposed in a punched portion of a tape-shaped substrate 71, and the active surface (the upper surface in FIG. 20) of the semiconductor chip 72 is sealed with a protective resin 73. Inner leads 74 are connected to the semiconductor chip 72 by single point bonding. The connection between the semiconductor chip 72 and an outer packaging substrate 80 is achieved by outer leads 75 connected to the inner leads 74 on the substrate 71. The three-dimensional packaging of the semiconductor device 70 is performed by connecting the outer leads 75 to the packaging substrate 80 respectively.

However, in this structure, it is necessary to individually connect outer leads 75 of each semiconductor device 70 to the packaging substrate 80. Therefore, the three-dimensional packaging steps are complicated and hard to perform.

Further, in this structure, since the outer leads 75 are pulled outwardly, there is a problem that the area occupied by the whole of the semiconductor device 70 becomes relatively large.

SUMMARY OF THE INVENTION

A first object of the present invention is to provide a method for manufacturing a semiconductor device capable of surely exposing projection electrodes by a simple step, and therefore capable of simplifying the whole manufacturing steps of the semiconductor device.

A second object of the present invention is to provide a method for manufacturing a semiconductor device capable of satisfactorily performing a back side grinding treatment of a semiconductor substrate by preventing the semiconductor substrate from being warped, and thereby capable of favorably manufacturing a thin-type semiconductor device.

A third object of the present invention is to provide a thin-type semiconductor device having a structure in which a semiconductor chip is bonded onto a solid device (for example, chip-on-chip structure), and a method for manufacturing the same.

A fourth object of the present invention is to provide a semiconductor device which is advantageous to be three-dimensionally packaged or mounted, and a method for manufacturing the same.

A method for manufacturing a semiconductor device according to a first aspect of the present invention comprises an electrode forming step of forming projection electrodes on the surface of a semiconductor substrate, a step of forming a protective resin layer on the whole surface of the semiconductor substrate provided with the projection electrodes, a back side grinding step of thinning the semiconductor substrate by polishing or grinding the back side of the semiconductor substrate, and a surface grinding step of exposing the projection electrodes by polishing or grinding the surface of the semiconductor substrate.

Either the back side grinding step or the surface grinding step may be performed first.

According to the present invention, the projection electrodes formed on the surface of the semiconductor substrate can be exposed by the surface grinding step comprising polishing or grinding the protective resin layer so formed as to cover the surface of the semiconductor substrate. Therefore, the projection electrodes can be exposed more simply, surely and in a shorter time than by etching. In the back side grinding step and the surface grinding step, the protective resin layer serves to reinforce the semiconductor substrate. Consequently, if the semiconductor substrate is ground to become thin in the back side grinding step, the semiconductor substrate can be handled without hindrance.

In such a manner, a thin-type semiconductor device can be manufactured by a simple manufacturing process and the productivity can be increased.

On the semiconductor substrate, a plurality of elements constituting a plurality of semiconductor devices may be formed. In this case, preferably, a plurality of groups of projection electrodes for the plurality of semiconductor devices are formed in the electrode forming step, and the semiconductor substrate after completing the surface grinding step and the back side grinding step is cut to cut out pieces of semiconductor devices.

According to this method, a plurality of semiconductor devices (semiconductor chips) are formed on a semiconductor substrate (semiconductor wafer). Before cutting out individual semiconductor devices from the substrate, the semiconductor substrate is subjected to the back side grinding treatment and the surface grinding treatment. In this case, the semiconductor substrate before reaching the cutting out step is reinforced by the protective resin layer on its surface. Therefore, if the semiconductor substrate has a small thickness, it is prevented from being broken when handled. Further, in the cutting out step, the semiconductor substrate is protected by the protective resin layer and prevented from being broken.

A method for manufacturing a semiconductor device according to a second aspect of the present invention comprises a step of forming a surface resin layer on the surface of a semiconductor substrate, a step of forming a back side resin layer on the back side of the semiconductor substrate, and a back side grinding step of thinning the semiconductor substrate by removing the back side resin layer, through polishing or grinding, from the semiconductor substrate provided with the surface resin layer and the back side resin layer, and further polishing or grinding the back side of the semiconductor substrate from which the back side resin layer has been removed.

Either the surface resin layer or the back side resin layer may be formed first, and the two layers may be formed at the same time. However, preferably, the surface resin layer and the back side resin layer are formed at such a short time interval that a warp of the semiconductor substrate, if caused, is insignificantly small. Otherwise, in order to prevent the semiconductor substrate from being significantly warped in the interval between forming the surface resin layer and forming the back side resin layer, the semiconductor substrate provided with either one layer is preferably put in a temperature-controlled environment till the other layer is formed.

According to this invention, since resin layers are formed on both of the surface and the back side of the semiconductor substrate, thermal expansion/contraction are equally caused in the surface and the back side of the semiconductor substrate. Consequently, in the back side grinding step, the semiconductor substrate is not in an undesirably warped state. Thus, the back side grinding step can be satisfactorily performed, so that the semiconductor substrate can be uniformly thinned in both of the central and peripheral regions. As a result, a thin-type semiconductor device can be favorably manufactured.

An embodiment of the present invention further comprises a cutting out step of cutting out individual pieces of semiconductor devices by cutting the semiconductor substrate along cutting lines after completing the back side grinding step.

According to this method, a plurality of pieces of semiconductor devices are cut out of the thinned semiconductor substrate. In this case, since the semiconductor substrate is uniformly thinned all over, pieces of thin-type semiconductor devices each having a uniform thickness can be obtained.

The method may further comprise an electrode forming step of forming projection electrodes on the surface of the semiconductor substrate, and a surface grinding step for polishing or grinding the surface resin layer so as to expose the projection electrodes from the surface resin layer. In this case, either the electrode forming step or the surface grinding step may be performed first. The cutting step is applied to the semiconductor substrate after completing the surface grinding step and the back side grinding step.

A semiconductor device of a first aspect of the present invention comprises a first semiconductor chip (an example of a solid device), a second semiconductor chip bonded onto the surface of the first semiconductor chip, projection electrodes for external connection formed on the surface of the first semiconductor chip, and a protective resin for sealing the surface of the first semiconductor chip in the state in which the head portions of the projection electrodes are exposed therefrom.

In this structure, the second semiconductor chip is bonded onto the surface of the first semiconductor chip. And the projection electrodes are formed on the same surface of the first semiconductor chip, and the surface of the first semiconductor chip is sealed with the protective resin in the state in which the head portions of the projection electrodes are exposed. Consequently, the whole height of the semiconductor device can be reduced in comparison with a case in which external connection electrodes are provided on the back side of the first semiconductor chip. As a result, a thin-type chip-on-chip semiconductor device can be realized.

The head portions of the projection electrodes may be in the same plane with the protective resin or may be protruded from the surface of the protective resin. Further, as long as the head portions of the projection electrodes are exposed, the head portions of the projection electrodes may be depressed inwardly from the surface of the protective resin.

Further, the second semiconductor chip may be embedded in the protective resin, or an inactive surface or a part of each side surface of the second semiconductor chip may be exposed from the protective resin.

A chip-on-chip type semiconductor device having the above-mentioned structure can be manufactured by a method comprising a chip bonding step of bonding a plurality of semiconductor chips face-down e.g. onto the surface of a semiconductor substrate with their active surfaces opposed to the surface of the semiconductor substrate, an electrode forming step of forming a plurality of projection electrodes on the surface of the semiconductor substrate, a resin sealing step of sealing, with a protective resin, the semiconductor chip and the exposed surface of the semiconductor substrate after forming the projection electrodes in such a manner that the head portions of the projection electrodes are exposed, and a cutting out step for taking out pieces of chip-on-chip type semiconductor devices by cutting the semiconductor substrate along the predetermined cutting lines.

According to this method, a plurality of semiconductor chips are bonded onto the surface of the semiconductor substrate, and at the same time, a plurality of projection electrodes are formed on the same surface of the semiconductor substrate. Therefore, in the state of a semiconductor substrate (semiconductor wafer), bonding of the semiconductor chips and forming of the projection electrodes can be performed. And thereafter, by cutting pieces of chip-on-chip type semiconductor devices out of the semiconductor substrate, a plurality of chip-on-chip type semiconductor devices can be efficiently manufactured.

Since the surface of the semiconductor substrate is sealed with the protective resin and the semiconductor chips are bonded face-down onto the surface of the semiconductor substrate, the surface of the semiconductor substrate and each surface (active surface) of the semiconductor chip are sufficiently protected. Consequently, it is possible to realize a thin-type semiconductor package having a height nearly equal to the sum of the thicknesses of the semiconductor substrate and the semiconductor chip mounted thereon.

Further, by polishing or grinding the back side of the semiconductor substrate and the back surface side (inactive surface side) of the semiconductor chip by a grinder or the like, before a cutting out step, at need, a thinner semiconductor device can be obtained.

The above-mentioned resin sealing step preferably includes an electrode exposing step of exposing the head portions of the projection electrodes by removing the surface layer section of the protective resin. Thereby, the projection electrodes can be surely exposed.

The surface layer section of the protective resin may be removed by grinding using a grinder or the like, but another method such as etching may be applied.

The above-mentioned electrode exposing step preferably includes a chip grinding step of simultaneously polishing or grinding the protective resin and the inactive surface side of the semiconductor chip. Thereby, the projection electrodes can be surely exposed and at the same time the semiconductor chip can be thinned.

A semiconductor device according to the second aspect of the present invention comprises a substrate (an example of a solid device), a semiconductor chip bonded face-down onto the surface of the substrate with its active surface opposed to the surface of the substrate, projection electrodes formed on and protruded from the surface of the substrate onto which the semiconductor chip is bonded, and a protective resin for sealing the projection electrodes and the semiconductor chip in such a manner that the head portions of the projection electrodes are exposed.

The projection electrodes are preferably provided surrounding the semiconductor chip (as close as possible to the semiconductor chip).

Further, the above-mentioned substrate is preferably a thin-type substrate such as a tape-shaped substrate or the like.

According to this invention, a semiconductor chip and projection electrodes functioning as external connection electrodes are provided on the surface on the same side of a substrate. In this structure, by forming through holes in the substrate for enabling the electrical connection from the back side of the substrate to the base potions of the projection electrodes, a plurality of three-dimensionally stacked semiconductor devices can be easily electrically connected to one another through the through holes.

Besides, by using projection electrodes, the area occupied by a semiconductor device can be reduced, and the lengths of the wirings of connecting three-dimensionally packaged or mounted semiconductor devices to one another can be shortened.

The above-mentioned through holes are preferably formed at the positions right below the projection electrodes.

The above-mentioned semiconductor device can be manufactured by a method comprising a chip bonding step of bonding a semiconductor chip face-down on the surface of a substrate with its active surface opposed to the surface of the substrate, an electrode forming step of forming a plurality of projection electrodes on the surface of the substrate so as to be protruded from the surface of the substrate, and a resin sealing step of sealing, with a protective resin, the semiconductor chip and the projection electrodes in such a manner that the head portions of the projection electrodes are exposed.

According to an embodiment of this method, a plurality of semiconductor chips are bonded onto the substrate in the chip bonding step, and a plurality of groups of projection electrodes corresponding to the plurality of semiconductor chips are formed in the electrode forming step. And by cutting the substrate along the predetermined cutting lines, pieces of semiconductor devices are cut out.

By this method, a plurality of semiconductor devices can be manufactured at the same time.

In this case, the resin sealing step is preferably performed so as to seal the plurality of semiconductor chips and the plurality of projection electrodes as a whole. The protective resin for sealing the plurality of semiconductor chips may be integrated or separated for each semiconductor chip. When the protective resin for sealing the plurality of semiconductor chips is integrated, preferably the protective resin and the substrate are cut at the same time in the cutting out step. Therefore, it is preferable to perform the cutting out step after the resin sealing step.

The resin sealing step may include a step of sealing, with a protective resin, the projection electrodes and the semiconductor chips, and a step of removing the surface layer section of the protective resin so as to expose the head portions of the projection electrodes.

Preferably, the above-mentioned method for manufacturing a semiconductor device may further comprise a step of thinning the semiconductor chip by polishing or grinding the inactive surface of the semiconductor chip. In this step, the whole of the device may be thinned by polishing or grinding the protective resin at the same time.

Preferably, for performing three-dimensional packaging or mounting, the method further comprises a step of forming through holes in the substrate for enabling the electrical connection from the back side of the substrate to the base portions of the projection electrodes. In this case, the through holes are preferably formed at the positions right below the projection electrodes.

The foregoing and other objects, features, aspects and advantages of the present invention will become more apparent from the following detailed description of embodiments of the present invention given with the accompanying drawings.

BRIEF DESCRIPTION OF THE DRAWINGS

FIG. 5 is a perspective view showing the structure of a semiconductor device according to a third embodiment of the present invention.

FIGS. 6(a) to 6(e) are sectional views showing steps in order of a method for manufacturing the semiconductor device of FIG. 5.

MODES FOR CARRYING OUT THE INVENTION

FIGS. 1(a) to 1(e) are schematically sectional views showing steps in order of a method for manufacturing a semiconductor device according to an embodiment of the present invention. A semiconductor wafer W (hereinafter referred to simply as wafer W) has been subjected to a variety of element forming steps, wiring forming steps and the like, and its surface 1 on an active surface layer region side is covered with a protective layer (passivation layer) comprising a nitride layer or the like. A pad (not shown) for external electric connection is exposed from the protective layer.

As shown in FIG. 1(a), a plurality of projection electrodes T made of, for example, gold (Au) are formed on the pad (electrode forming step). Preferably, these projection electrodes T are formed by, for example, electrolytic plating, and the height of each projection electrode T from the surface of the protective layer is, for example, about 25 µm. Each projection electrode T is in the form of a cylinder such as a circular cylinder or a rectangular cylinder. In addition to gold, solder and the like can be used as the material of the projection electrodes.

After forming the projection electrodes T, as shown in FIG. 1(b), a protective resin layer 3 is formed over substantially the whole of the surface of the wafer W (protective resin layer forming step). The protective resin layer 3 is formed of, for example, an epoxy resin or the like and by, for example, a screen printing method. Preferably, the protective resin layer 3 has a thickness capable of embedding the projection electrodes T thereinto. In concrete, the protective resin layer 3 preferably has a thickness of about 100 µm and such a protective resin layer 3 can fulfill its function of reinforcing the wafer W which has been subjected to the back side grinding treatment even after the following surface grinding treatment.

Figure 1:
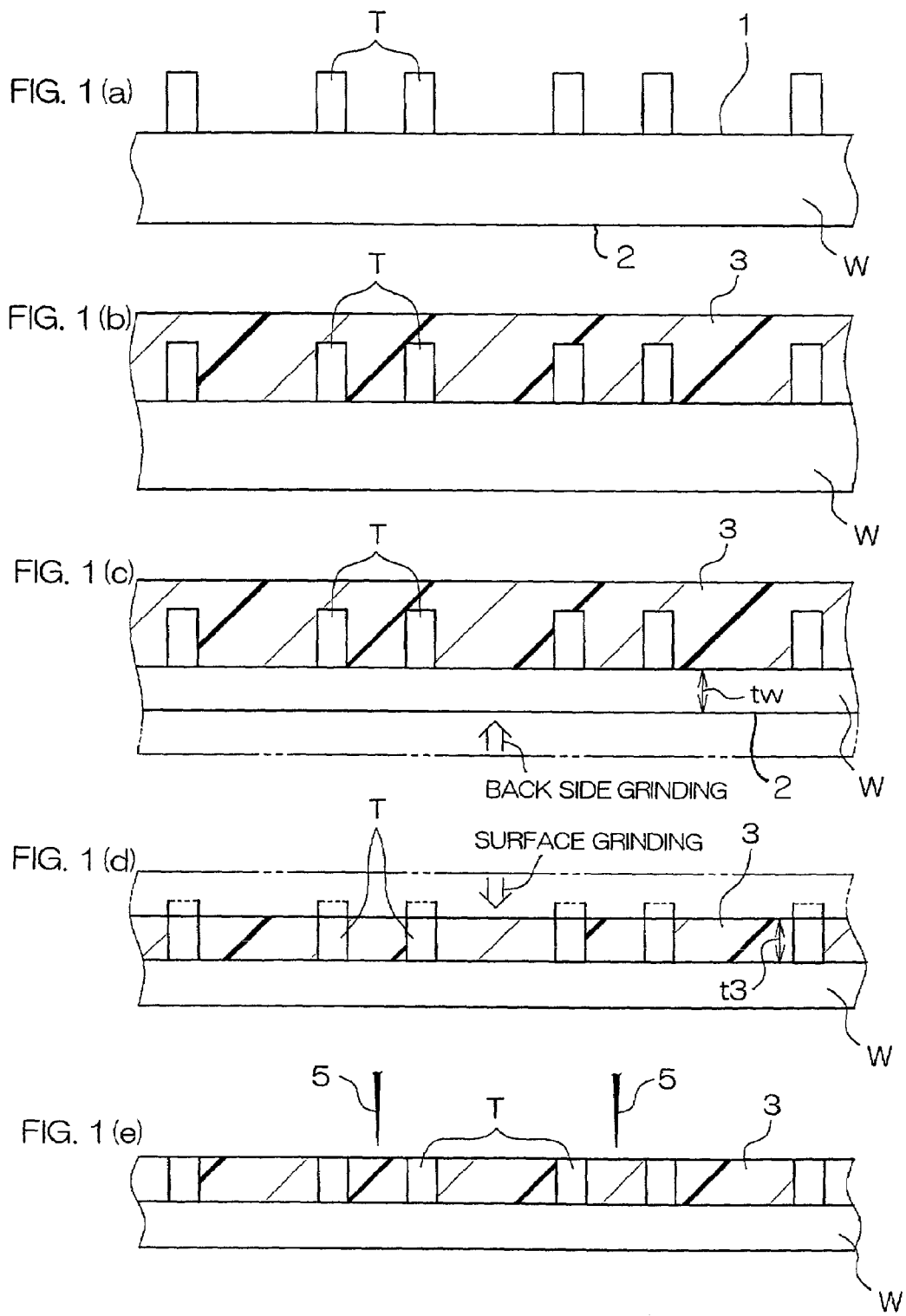
FIGS. 1(a) to 1(e) are schematically sectional views showing steps in order of a method for manufacturing a semiconductor device according to a first embodiment of the present invention.

Thereafter, as shown in FIG. 1 (c), the back side 2 of the wafer W is ground, for example, using a grinder (back side grinding step). Thereby the wafer W is thinned to a predetermined thickness tw (for example, tw being about 50 µm). Since the surface 1 of the wafer W is protected by the protective resin layer 3, it is not necessary to use a protective film or the like for protecting the wafer W in the back side grinding step.

Further, as shown in FIG. 1 (d), the surface 1 of the wafer W is ground similarly using, for example, a grinder (surface grinding step). Precisely, the surface of the protective resin layer 3 is ground to expose the head portions of the projection electrodes T, and after the projection electrodes T are exposed, both of the protective resin layer 3 and the projection electrodes T are simultaneously ground. This surface grinding treatment is performed till the thickness t3 of the protective resin layer 3 becomes, for example, about 50 μm. After the surface grinding step is completed, the surface of the protective resin layer 3 and the top surfaces of the projection electrodes T are in the same plane. In this surface grinding step, the back side of the wafer W must be held by, for example, a vacuum chuck device, but it need not be particularly protected by a protective film or the like.

Figure 2:
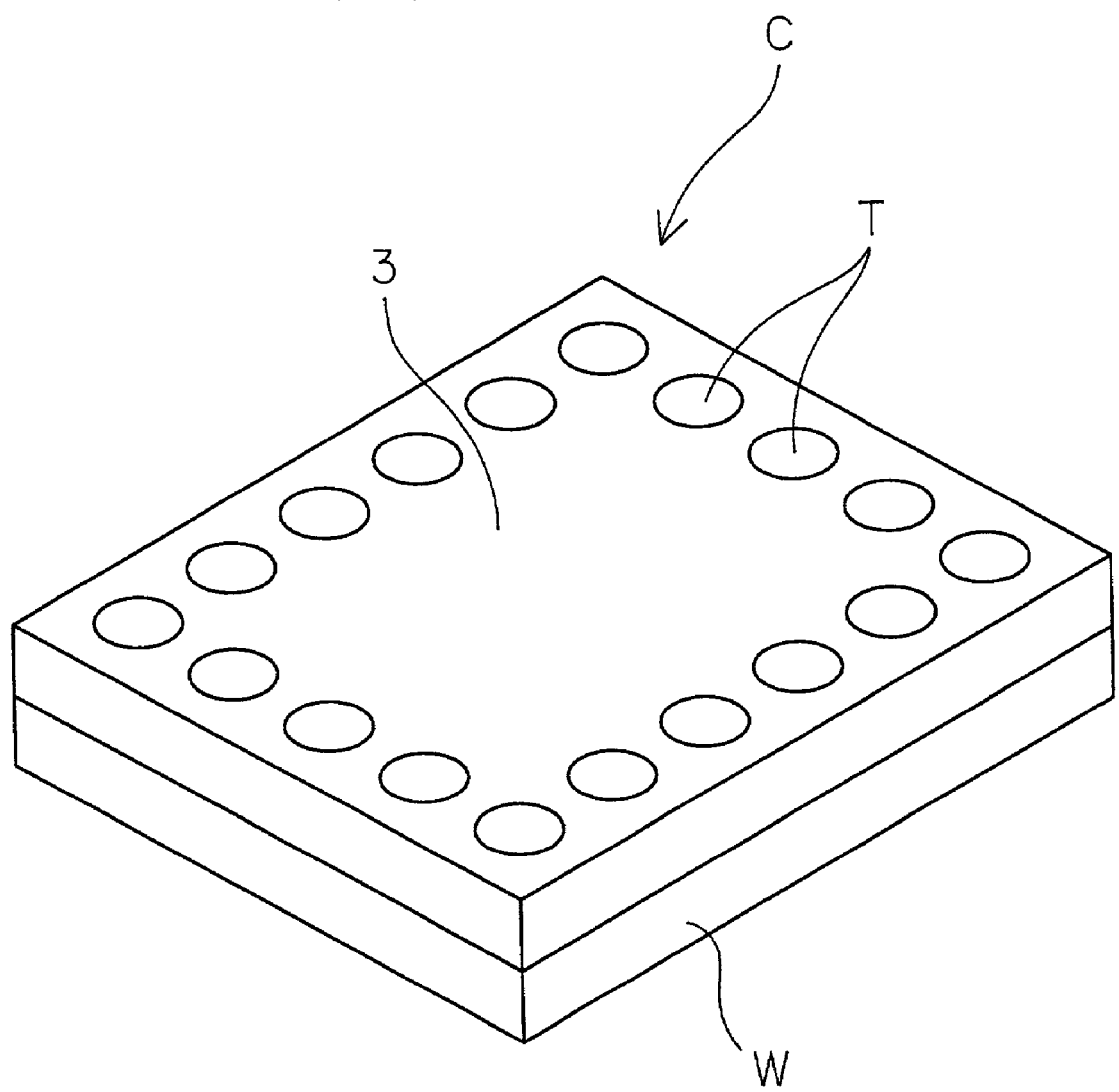
FIG. 2 is a schematically perspective view of a semiconductor device manufactured by the method of FIGS. 1(a) to 1(b).

Thereafter, as shown in FIG. 1(e), the protective resin layer 3 and the wafer W are cut by a dicing saw 5 along scribed lines, and pieces of semiconductor chips C, the perspective view of each of which is shown in FIG. 2, are cut out (cutting out step).

In the back side grinding step and the surface grinding step, the whole of the wafer w is reinforced by the protective resin layer 3 formed on the surface 1 of the wafer W. Therefore, the wafer W is satisfactorily ground without being broken, so that thinning of the wafer W can be advantageously performed.

Further, in handling the wafer W before the cutting out step and in cutting the wafer W by the dicing saw 5, the protective resin layer 3 reinforces the wafer W, and therefore, the wafer W and the semiconductor chips C are prevented from being broken. Accordingly, the wafer W can be thinned to a desired thickness, which can contribute to thinning of the semiconductor chips.

In the final shape of the semiconductor chip C shown in FIG. 2, the protective resin layer 3 protects the surface 1 (active surface) of the wafer W. Further, the top surfaces of the projection electrodes T are exposed from the protective resin layer 3. Therefore, it is not necessary to package additionally the semiconductor chip C. By the abovementioned steps, highly thinned semiconductor package can be obtained.

According to this embodiment, as abovementioned, it is possible to manufacture thin-type semiconductor chips C in which the projection electrodes T are surely exposed, by simple and short time treatment of grinding a wafer W from both sides of the surface and the back thereof. This can simplify the process of manufacturing thin-type semiconductor chips C and contribute to the improvement of the productivity thereof.

In the abovementioned embodiment, the back side grinding step (FIG. 1 (c)) is performed first, and then the surface grinding step (FIG. 1(d)) is performed. However, it is possible to perform the surface grinding step first and then the back side grinding step.

Figure 3A:
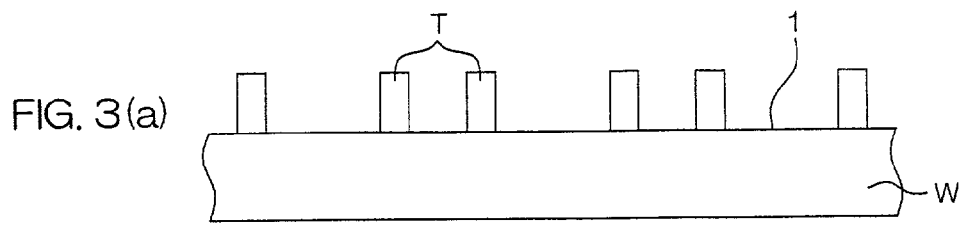
FIGS. 3(a) to 3(f) are schematically sectional views showing steps in order of a method for manufacturing a semiconductor device according to a second embodiment of the present invention.

FIGS. 3(a) to 3(f) are schematically sectional views showing steps in order of a method for manufacturing a semiconductor device according to a second embodiment of the present invention. In FIGS. 3(a) to 3 (f), parts corresponding to the parts in FIGS. 1(a) to 1(e) are given the same reference characters with those of the parts in FIGS. 1(a) to 1 (e).

A semiconductor wafer W (hereinafter referred to simply as wafer W) shown in FIGS. 3(a) to 3(e) has been subjected to a variety of element forming steps, wiring forming steps and the like, and its surface 1 on an active surface layer region side is covered with a protective layer (passivation layer) comprising a nitride layer. A pad (not shown) for external electric connection is exposed from the protective layer.

As shown in FIG. 3(a), a plurality of projection electrodes T made of, for example, gold (Au) are formed on the pad (electrode forming step). Preferably, these projection electrodes T are formed by, for example, electrolytic plating, and the height of each projection electrode T from the protective layer is, for example, about 50 μm. Each projection electrode T is in the form of a cylinder such as a circular cylinder or a rectangular cylinder. In addition to gold, solder and the like can be used as the material of the projection electrodes.

Figure 3B:
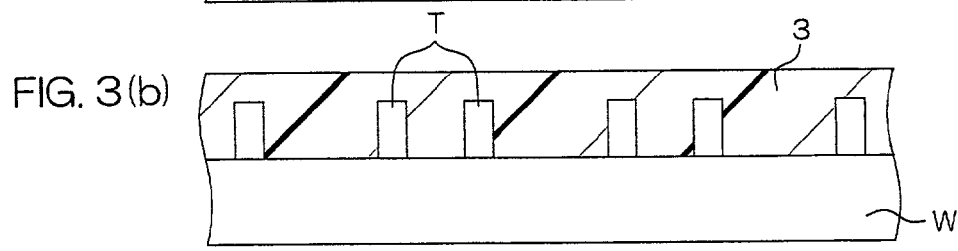

After forming the projection electrodes T, as shown in FIG. 3(b), a protective resin layer is formed over substantially the whole of the surface of the wafer W (protective resin layer forming step). The protective resin layer 3 is formed of, for example, an epoxy resin or the like and by, for example, a screen printing method. Preferably, the protective resin layer 3 has a thickness capable of embedding the projection electrodes T thereinto. In concrete, the protective resin layer 3 preferably has a thickness of about 100 μm and such a protective resin layer 3 can fulfill its function of reinforcing the wafer W which has been subjected to the back side grinding treatment even after the following surface grinding treatment.

Figure 3C:
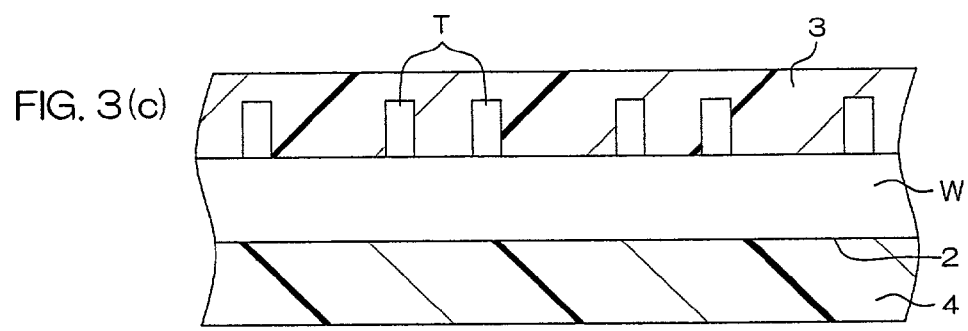

After forming the protective resin layer 3, a back side resin layer 4 is formed over substantially the whole of the back side 2 of the wafer W as shown in FIG. 3(c). Preferably, the back side resin layer 4 is formed of the same material as that of the protective resin layer 3 and has a thickness substantially equal to that of the protective resin layer 3. Further, the back side resin layer 4 can be formed by a similar forming method to that of the protective resin layer 3.

Preferably, the protective resin layer 3 forming step and the back side resin layer 4 forming step are performed successively or simultaneously in order to prevent such a temperature change as causing warping of the wafer W. If it is necessary to form the back side resin layer 4 a relatively long time after forming the protective resin layer 3, the wafer W after completing the protective resin layer 3 forming step is preferably put in a temperature-controlled environment in order to prevent warping of the wafer W caused by the differences between the thermal expansion/contraction coefficients of the protective resin layer 3 and the wafer W.

Figure 3D:
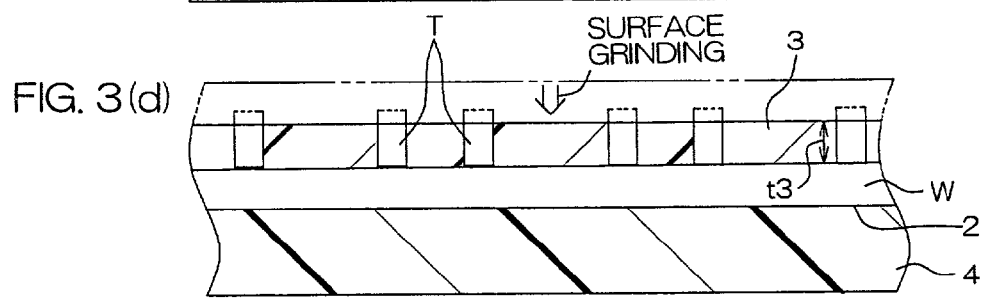

After the back side resin layer 4 is formed on the back side 2 of the wafer W, as shown in FIG. 3(d), the surface 1 of the wafer W is ground using, for example, a grinder (surface grinding step). Precisely, the surface of the protective resin layer 3 is ground to expose the head portions of the projection electrodes T, and after the projection electrodes T are exposed, both of the protective resin layer 3 and the projection electrodes T are simultaneously ground. This surface grinding is performed till the thickness t3 of the protective resin layer 3 becomes, for example, about 40 μm. After the surface grinding step is completed, the surface of the protective resin layer 3 and the top surfaces of the projection electrodes T are in the same plane. In this back side grinding step, the back side of the wafer W must be held by, for example, a vacuum chuck device, and at that time the back side 2 of the wafer W is protected by the back side resin layer 4.

Figure 3E:
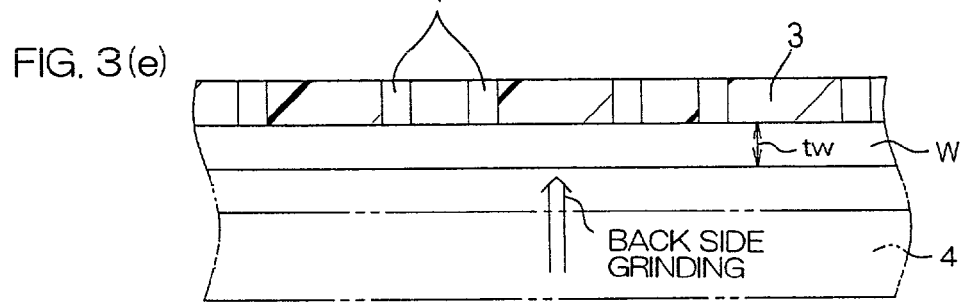

Further, as shown in FIG. 3(e), the back side grinding step is performed, similarly, for example, using a grinder. In other words, the back side resin layer 4 is ground and removed away, and further the back side 2 of the wafer W is successively ground. Thereby the wafer W is thinned to a predetermined thickness tw (for example, tw being about 100 μm). Since the surface 1 of the wafer W is protected by the protective resin layer 3, it is not necessary to use a protective film or the like for protecting the wafer W in the back side grinding step.

Figure 3F:
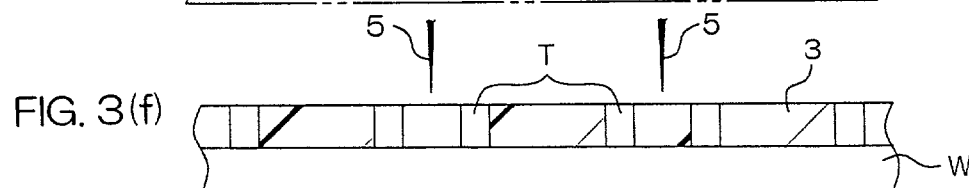
Figure 4:
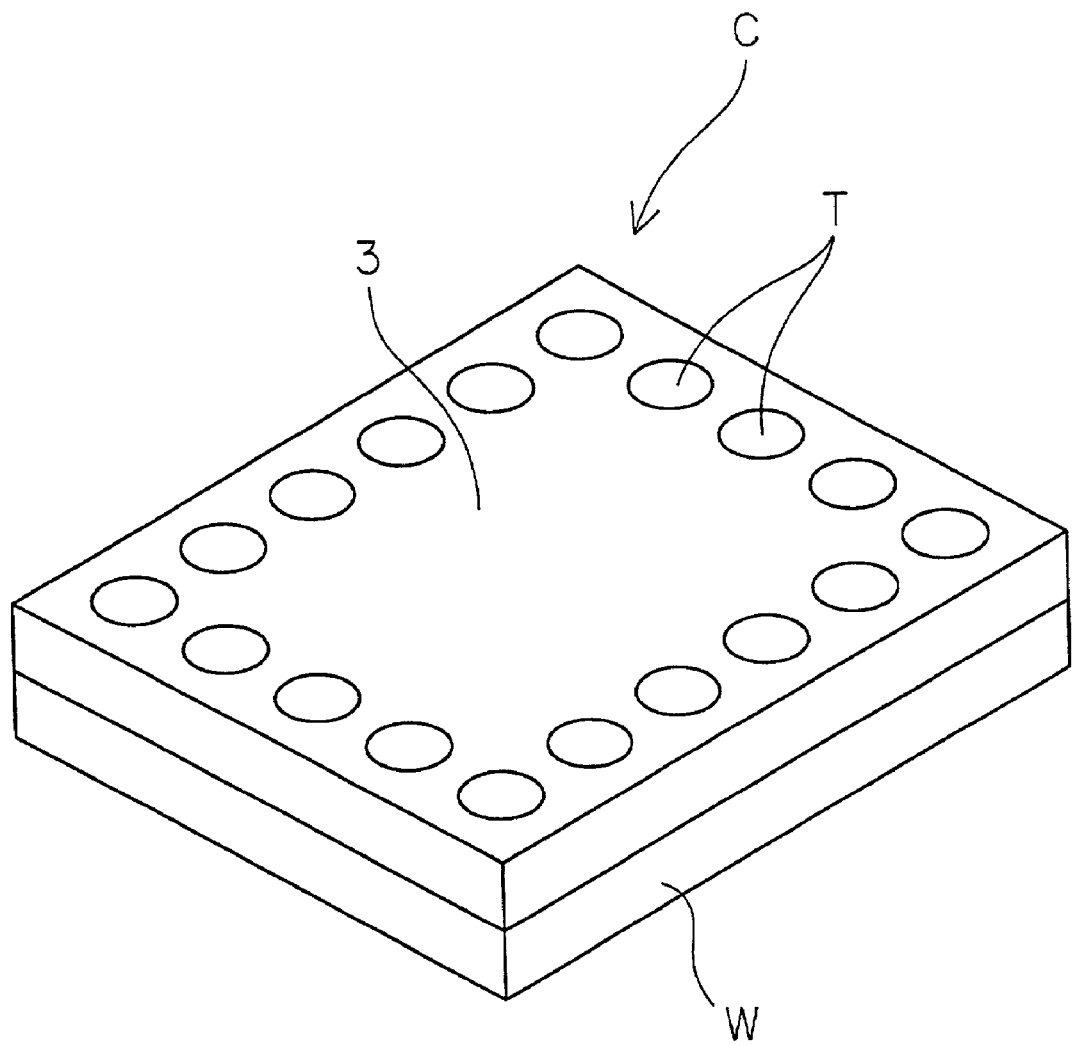
FIG. 4 is a schematically perspective view of a semiconductor device manufactured by the method of FIGS. 3(a) to 3(e).

Thereafter, as shown in FIG. 3(f), the protective resin layer 3 and the wafer W are cut by a dicing saw 5 along scribed lines (cutting lines) and pieces of semiconductor chips C, the perspective view of each of which is shown in FIG. 4, are cut out (cutting out step) In the back side grinding step and the surface grinding step, the whole of the wafer w is reinforced by the protective resin layer 3 formed on the surface 1 of the wafer W. Therefore, the wafer W is satisfactorily ground without being broken, so that thinning of the wafer W can be advantageously performed.

Further, in handling the wafer W before the cutting out step and in cutting the wafer W by the dicing saw 5, the protective resin layer 3 reinforces the wafer W, and therefore, the wafer W and the semiconductor chips C are prevented from being broken. Accordingly, the wafer W can be thinned to a desired thickness, which can contribute to thinning of the semiconductor chips.

In the final shape of the semiconductor chip C shown in FIG. 4, the protective resin layer 3 protects the surface 1 (active surface) of the wafer W. Further, the top surfaces of the projection electrodes T are exposed from the protective resin layer 3. Therefore, it is not necessary to package additionally the semiconductor chip C. By the above-mentioned steps, highly thinned semiconductor packages can be obtained.

As mentioned above, in this embodiment, a protective resin layer 3 is formed on the surface 1 of a wafer W and a back side resin layer 4 is formed on the back side 2 of the wafer W, so that thermal expansion/contraction on the surface and the back side of the wafer W equally occur. Therefore, in the surface grinding step (FIG. 3(d)) and the back side grinding step (FIG. 3(e)), warp of the wafer W does not occur. Accordingly, each of the protective resin layer 3 and the back side 2 of the wafer W can be ground uniformly in any portion of the wafer W. As a result, a plurality of chips C cut out by the cutting out step (FIG. 3(f)) have a uniform thickness.

When a wafer W is, for example, in the state immediately after completing the surface grinding step as shown in FIG. 3 (d)), the resin layers 3, 4 on the surface and the back side of the wafer W respectively are different in thickness from each other. And if the warp of the wafer W caused by the difference in thickness between the layers 3,4 becomes a problem, it can be solved by holding the surface and the back side of the wafer by, for example, a chuck. After the back side grinding step is completed, the protective resin layer 3 is sufficiently thinned, so that undesirable warp of the wafer W can be prevented from occurring.

Though the surface grinding step (FIG. 3(d)) is performed first and then the back side grinding step (FIG. 3(e)) is performed in the above-mentioned embodiment, the surface grinding step may be performed after the back side grinding step. However, for the purpose of grinding a protective resin layer 3 uniformly in any portion of the wafer W, it is preferable to perform the surface grinding step first.

FIG. 5 is a perspective view showing the structure of a semiconductor device according to a third embodiment of the present invention. The semiconductor device 10 has a chip-on-chip structure in which a secondary chip D (the second chip) is bonded face-down onto the surface (active surface) of a primary chip M(the first chip) with the surfaces (active surfaces) of the two chips M,D opposed to each other. Each of the primary chip M and the secondary chip D is formed of, for example, a silicon chip, and active elements such as a transistor, passive elements such as a resistance and a capacitor, wiring or the like are formed on the surface of each chip.

In this embodiment, each of the primary chip M and the secondary chip D is formed in a rectangular shape when viewed inplan, and the secondary chip D is somewhat smaller than the primary chip M when viewed in plan. A plurality of projection electrodes (cylindrical electrodes in this embodiment) T functioning as external connection electrodes are provided in a region surrounding the secondary chip D on the surface (active surface) of the primary chip M.

The region, in which the secondary chip D or the projection electrodes T are not provided, of the surface of the primary chip M is sealed with a protective resin (for example, epoxy resin) 11 so as to protect the surface of the primary chip M. Since the surface of the secondary chip D is opposed to the primary chip M and the side surfaces of the secondary chip Dare sealed with the protective resin 11, the secondary chip D is protected from outside.

In this embodiment, the protective resin 11, the top surfaces of the projection electrodes T and the inactive surface of the secondary chip D are in the same plane.

The semiconductor device 10 with such a structure can be formed to be an extremely thin semiconductor device having a height nearly equal to the sum of the thicknesses of the primary chip M and the secondary chip D. Therefore, a thin-type chip-on-chip semiconductor device can be realized.

FIGS. 6(a) to 6(e) are sectional views showing steps in order of a method for manufacturing the above-mentioned semiconductor device 10. A protective layer (passivation layer) comprising a nitride layer or the like is formed on the surface (active surface) Wa of a semiconductor wafer W (hereinafter referred to simply as wafer W) as a semiconductor substrate. And pads of internal wiring are exposed from a plurality of portions of the protective layer in which external connections are required. As shown in FIG. 6 (a), a plurality of projection electrodes T and a plurality of bumps B are formed on these pads (electrode forming step). The projection electrodes T are formed on the pads for external connection, while the bumps B are formed on the pads for chip-to-chip connection to be connected to the secondary chip D. The projection electrodes T and the bumps B can be formed of the same material, and they are preferably formed of an oxidization-resisting metal, for example, gold. Further, the projection electrodes T are preferably formed to be higher than the bumps B.

Thereafter, as shown in FIG. 6(b), the secondary chip D is bonded face-down onto the surface Wa of the wafer W with the surface (active surface) Da of the secondary chip D opposed to the surface Wa of the wafer W (chip bonding step). And then, the surface Wa of the wafer W, the projection electrodes T and the bumps B are resin-sealed with a protective resin 11 (resin sealing step). At this time, the head portions of the projection electrodes T and/or the back side (inactive surface) Db of the secondary chip D may be left exposed from the protective resin 11, as long as the exposed portions of the surface Wa of the wafer W are covered with the protective resin 11.

Then, as shown in FIG. 6(c), the back side (inactive surface) Wb of the wafer W is polished or ground by a grinder, thereby further thinning the semiconductor device.

Thereafter, as shown in FIG. 6(d), the projection electrodes T are exposed by polishing or grinding the protective resin 11 by a grinder (electrode exposing step) Further, after the grinding position reaches the inactive surface Db of the secondary chip D, the protective resin 11 and the inactive surface Db of the secondary chip D are simultaneously polished or ground (chip grinding step), thereby further thinning the secondary chip D and the protective resin 11.

After that, as shown in FIG. 6(e), the wafer W and the protective resin 11 are cut along scribed lines (cutting lines)

L by a dicing saw 15. As a result, pieces of semiconductor devices 10 having a structure shown in FIG. 5 are cut out, in each of which a secondary chip D is bonded onto a primary chip M cut out of the wafer W.

Either of the step of FIG. 6(c) and the step of FIG. 6(d) may be performed first, and the step of FIG. 6(c) may be omitted if unnecessary.

According to this embodiment, as mentioned above, a secondary chip D is bonded onto a primary chip M before the primary chip M is cut out of a wafer W, and projection electrodes T functioning as external connection electrodes are formed on the surface Wa of the wafer W on which the secondary chip D is bonded. Further, by cutting the wafer W with its surface Wa protected by a protective resin 11, pieces of packaged semiconductor devices 10 having a chip-on-chip structure can be obtained. Therefore, it is possible to efficiently manufacture thin-type chip-on-chip semiconductor devices.

Figure 7:
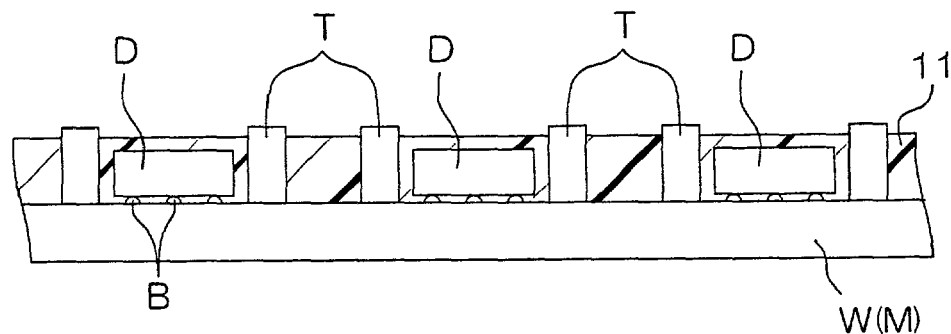
FIG. 7 is a sectional view showing the structure of a semiconductor device according to another embodiment of the present invention.
Figure 8:
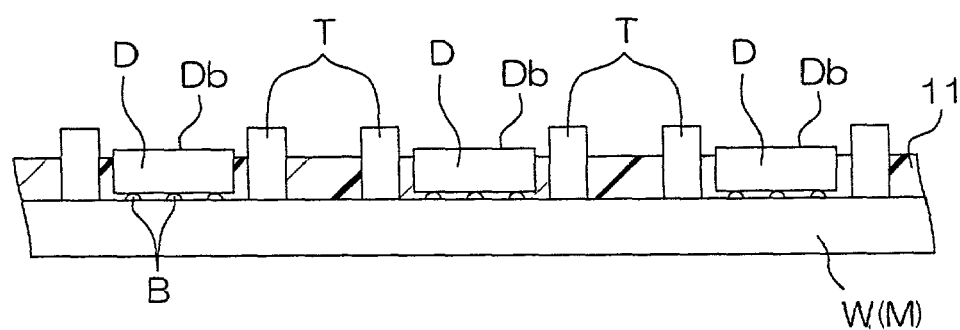
FIG. 8 is a sectional view showing the structure of a semiconductor device according to a further embodiment of the present invention.

In the above-mentioned embodiment, the protective resin 11, the projection electrodes T and the inactive surface Db of the secondary chip D are in the same plane. However, the head portions of the projection electrodes T may be protruded from the surface of the protective resin 11 as in the fourth embodiment shown in FIG. 7. Further, the inactive surface Db side of the secondary chip D may be protruded from the protective resin 11 as in the fifth embodiment shown in FIG. 8. The structures shown FIGS. 7 and 8 can be formed, for example, by sufficiently thinning the protective resin 11. In these cases, if the protective resin 11 tends to adhere to the head portions of the projection electrodes T, the protective resin adhered to the head portions of the projection electrodes T can be removed by polishing or grinding by a grinder or etching.

Figure 9:
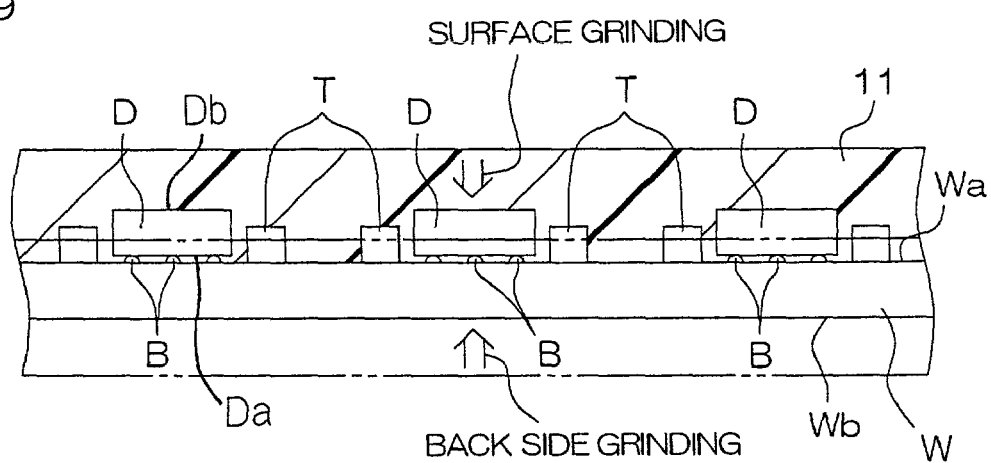
FIG. 9 is a sectional view explaining steps of a method for manufacturing a semiconductor device according to a further embodiment of the present invention.

Further, in the above-mentioned embodiment, the projection electrodes T are higher than the inactive surface Db of the secondary chip D. However, the height of the projection electrodes T may be lower than the inactive surface Db of the secondary chip D, as in the sixth embodiment shown in FIG. 9 (the height being, for example, less than 100 μm). Even in this case, after the back side grinding step (grinding to the position indicated by a solid line) and the surface grinding step (grinding to the position indicated by a two dots and dash line) are completed, the same structure as that of the first embodiment can be obtained. By making low the height of the projection electrodes T, the projection electrodes T can be easily formed in a short time and the material thereof can be reduced. Thereby the productivity can be improved and the manufacturing cost can be reduced. However, in order to grind simultaneously the secondary chip D and the projection electrodes T and thereby make their surfaces in the same plain, the height of each projection electrode T formed at the beginning is preferably higher than the active surface Da of the secondary chip D.

Further, in the above-mentioned embodiment, an example is described in which a secondary chip D is bonded to a primary chip M. However, two or more secondary chips D may be bonded to a primary chip M.

Further, though each of the projection electrodes T is in the form of a cylinder in the above-mentioned embodiment, it may be in the form of a bump.

Furthermore, in the abovementioned embodiment, the primary chip M and the secondary chip D are formed of silicon semiconductors, respectively. However, in addition to silicon semiconductors, semiconductor chips formed of other arbitrary materials such as gallium arsenic semiconductors or germanium semiconductors can be applied to a semiconductor device according to the present invention. In this case, the semiconductor materials of the primary chip M and the secondary chip D may be the same or different from each other.

Figure 10:
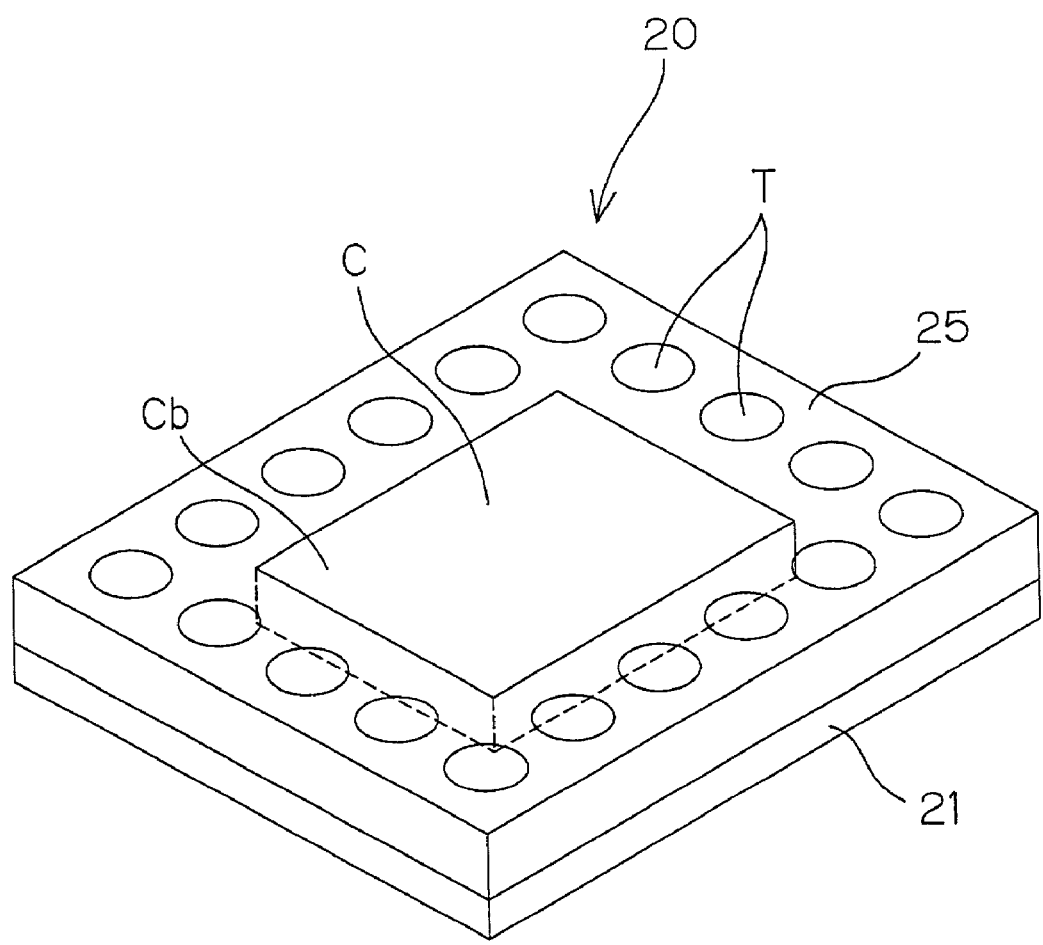
FIG. 10 is a perspective view showing the structure of a semiconductor device according to an embodiment of the present invention.

FIG. 10 is a perspective view showing the structure of a semiconductor device according to the seventh embodiment of the present invention. The semiconductor device 20 has a structure in which a semiconductor chip C is bonded face-down onto the surface of a tape-shaped wiring substrate 21 such as a polyimide substrate or a glass epoxy substrate with the active surface of the semiconductor chip C opposed to the surface of the substrate 21. In this embodiment, the semiconductor chip C is formed in a rectangular shape when viewed in plan. A plurality of projection electrodes (cylindrical electrodes in this embodiment) T protruded from the surface of the substrate 21 and functioning as external connection electrodes are provided in a region surrounding the semiconductor chip C.

The region, in which the semiconductor chip C or the projection electrodes T are not provided, of the surface of the substrate 21 is resin-sealed with a protective resin (for example, epoxy resin) 25. The protective resin 25 reinforces the whole of the semiconductor device 20 and serves to prevent the projection electrodes T from being deformed. Since the surface of the semiconductor chip C is opposed to the substrate 21 and the side surfaces of the semiconductor chip C are sealed with the protective resin 25, the semiconductor chip C is protected from outside.

In this embodiment, the protective resin 25, the head surfaces of the projection electrodes T and the inactive surface Cb of the semiconductor chip C are in the same plane.

Figure 11A:
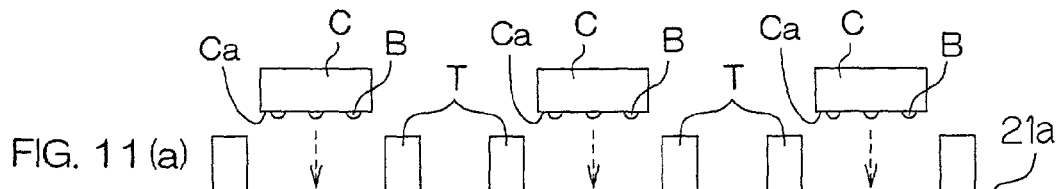
FIGS. 11(a) to 11(f) are sectional views showing steps in order of a method for manufacturing the semiconductor device of FIG. 10.

FIGS. 11(a) to 11(e) are sectional views showing steps in order of fabricating the above-mentioned semiconductor device. FIG. 11(a) shows a semiconductor chip bonding step. A wiring pattern is preliminarily formed on the substrate 21 such as a polyimide substrate, for example, by copper electrolytic plating or the like. On the wiring pattern, a plurality of projection electrodes T are formed (electrode forming step). A plurality of semiconductor chips C are bonded face-down onto the surface 21a of the substrate 21 on which the projection electrodes T are formed. That is, each of the semiconductor chips C is bonded, through bumps B formed thereon, onto the substrate 21 with its active surface Ca i.e. the surface on the active surface layer side on which elements such as a transistor and a resistance are formed being opposed to the substrate 21, and the semiconductor chips C are electrically connected to the wiring pattern formed on the substrate 21. As a result, the semiconductor chips C are electrically connected to the projection electrodes T through the wiring pattern formed on the substrate 21.

The semiconductor chips C bonded onto the substrate 21 have a rather large thickness, for example, about 300 μm to 700 μm. Such semiconductor chips C can be obtained by dividing a 300 μm to 700 μm thick semiconductor wafer (not shown) by a dicing saw. Such a sufficiently thick wafer are not broken or chipped off in the dicing step. In addition, the thick semiconductor chips C obtained through the dicing step are not broken or chipped off in the subsequent handling process for bonding the same onto the substrate 21.

After the semiconductor chips C are bonded onto the substrate 21, a liquid resin (underfill) is injected into spaces between the active surfaces Ca and the substrate 21 at need.

Figure 11B:
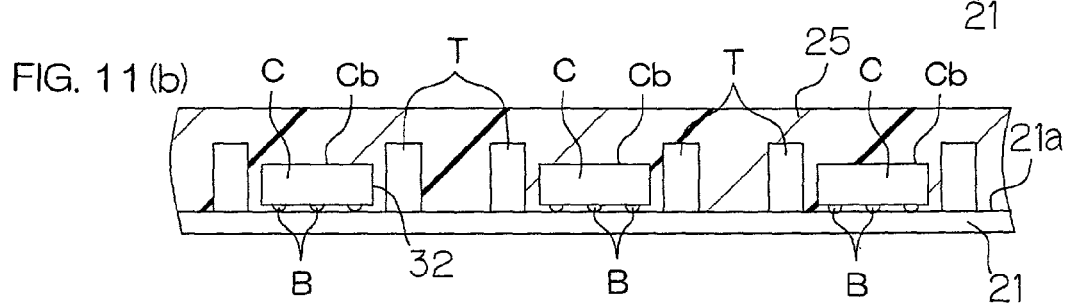

FIG. 11(b) shows a resin sealing step performed subsequently to the semiconductor chip bonding step. In this resin sealing step, a metal mold (not shown) is used. Formed in this metal mold is a cavity for wholly containing the semiconductor chips C bonded onto the substrate 21 and the projection electrodes T provided around the semiconductor chips C. And the semiconductor chips C on the substrate 21 and the projection electrodes T are wholly sealed with the protective resin 25 (resin sealing step). Thereby, the side walls 32 and the inactive surface Cb in opposite to the active surface Ca of each semiconductor chip C are covered with the protective resin 25, and each projection electrode T is wholly embedded in the protective resin 25. Further, the side portions of the space between each active surface Ca and the substrate 21 are sealed with the protective resin 25, so that the active surface Ca is protected.

However, in this resin sealing step, the head portion of each projection electrode T and/or the back side (inert surface) Cb of each semiconductor chip C may be left exposed from the protective resin 25.

Figure 11C:
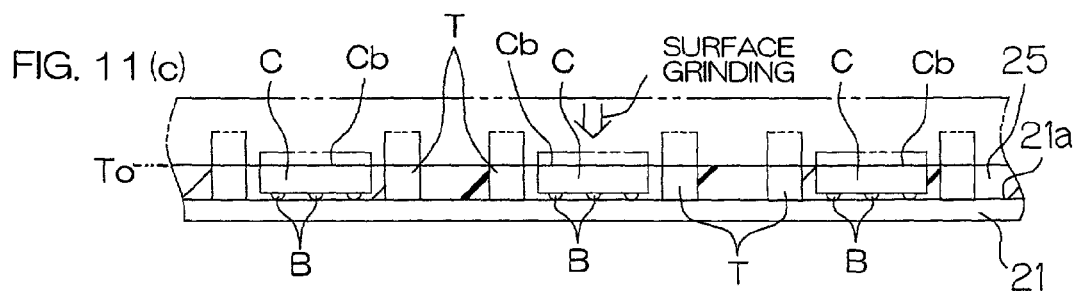

FIG. 11(c) shows a grinding step performed subsequently to the resin sealing step and after the protective resin 25 is hardened. In this grinding step, grinding is carried out to a grinding target thickness To using a grinder. That is, the protective resin 25 is ground and thereby the inactive surfaces Cb of semiconductor chips C are exposed. After that, grinding of the protective resin 25 and grinding of the inactive surface Cb side of the semiconductor chips C are simultaneously carried out, to reach the grinding target thickness To. The grinding target thickness To is set so that the thickness t of the semiconductor chip C after being ground becomes, for example, about 100 μm to 200 μm.

Figure 11D:
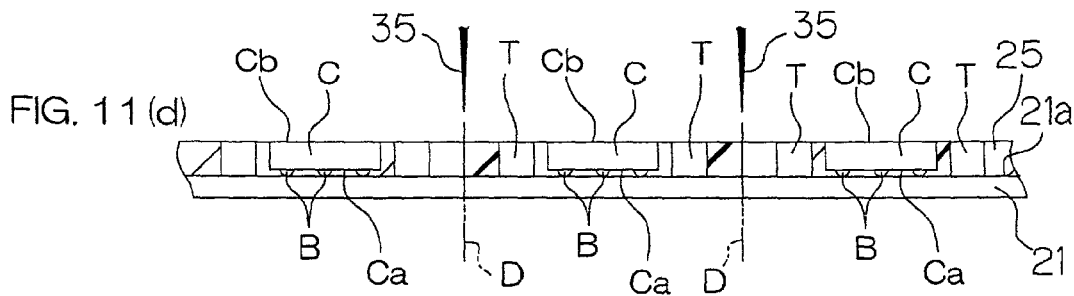
Figure 11E:
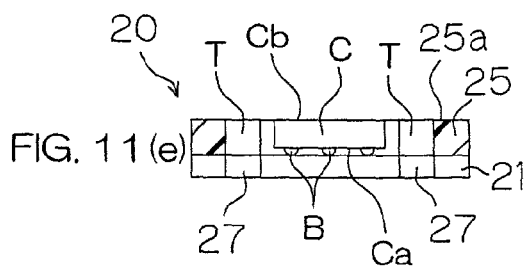

Then, as shown in FIG. 11(d), the protective resin 25 and the substrate 21 are cut along cutting lines D provided between semiconductor chips C e.g. using a dicing saw 35, thereby pieces of semiconductor devices 20 being cut out as shown in FIG. 11(e). In each semiconductor device 20 cut out by this cutting out step, the whole of the side walls of the semiconductor chip C are covered with the protective resin 25. The upper surface 25a of the protective resin 25 and the inactive surface Cb after being ground are in the same plane, and the corners of the semiconductor chip C is covered with the protective resin 25, so that the semiconductor chip C is protected in any portion thereof.

In each piece of semiconductor device 20 thus cut out, as shown in FIG. 11(e), through holes 27 are provided at need in the substrate 21 at the positions right below the base portions of the projection electrodes T. These through holes 27 are provided so that electric connection can be made from the back side of the substrate 21 to the projection electrodes T through the through holes 27.

Figure 11F:
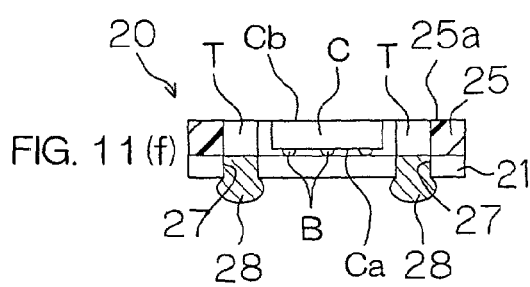
Figure 12:
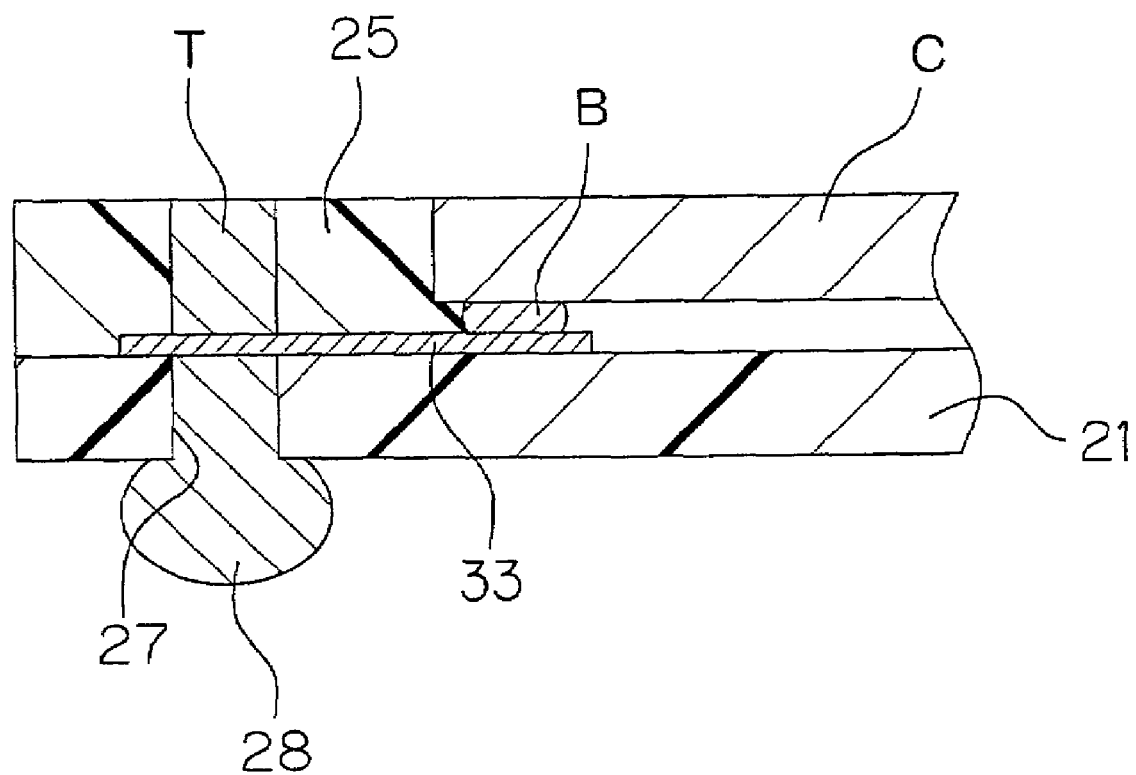
FIG. 12 is an enlarged sectional view showing the structure in the vicinity of the projection electrodes.

Further, as shown in FIG. 11(f), e.g. solder balls 28 are formed at need in the through holes 27 by being transferred by printing. The solder ball 28 is connected at need to the wiring pattern 33 formed on the surface 21a side of the substrate 21 through the through hole 27 by reflowing, as shown in FIG. 12. The semiconductor chip C is connected through a bump B to this wiring pattern 33, and the projection electrode T is bonded to the wiring pattern 33 at another position.

Figure 13:
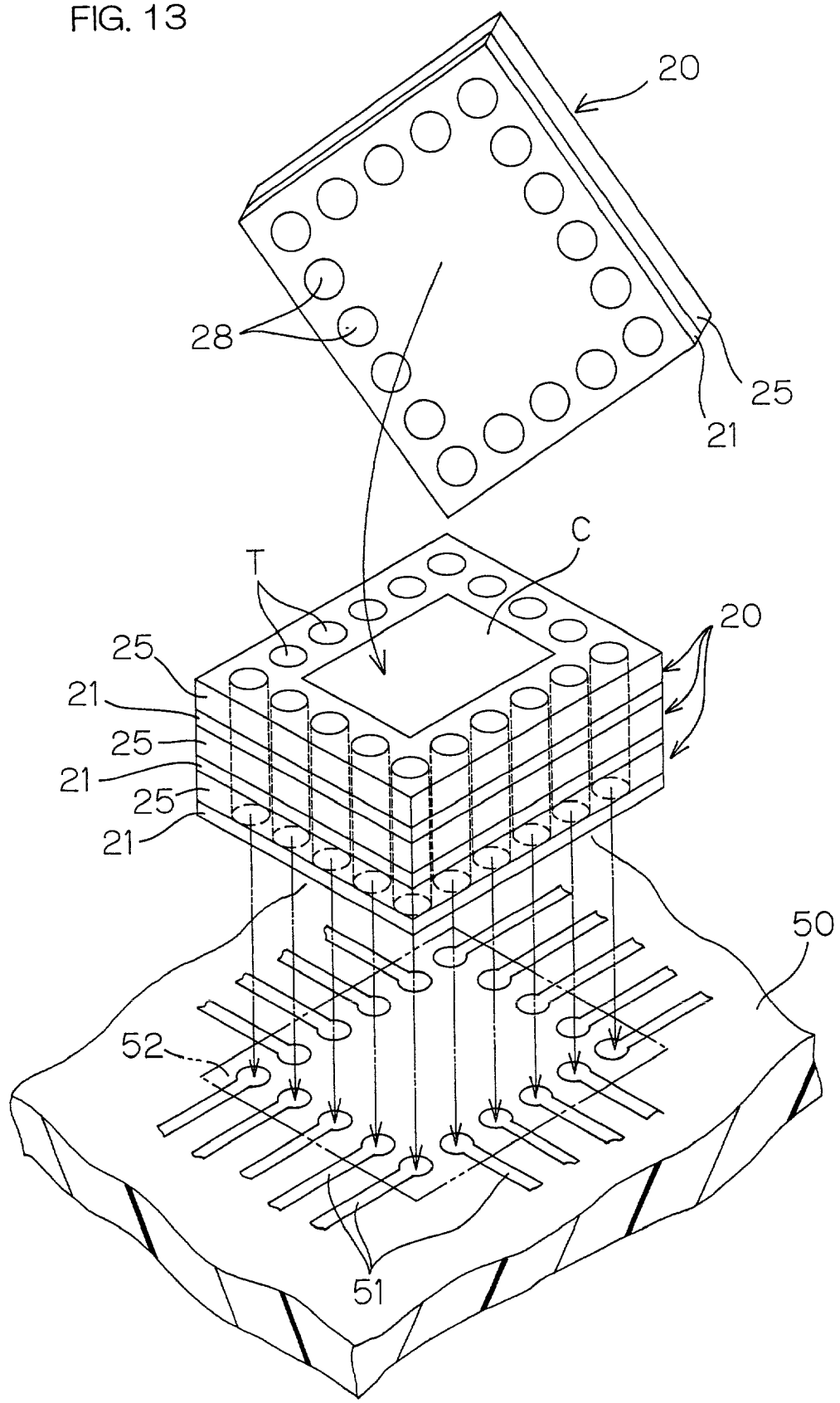
FIG. 13 is a perspective view explaining the three-dimensional packaging of the abovementioned semiconductor devices.

FIG. 13 is a perspective view explaining three-dimensional packaging or mounting of the above-mentioned semiconductor devices 20. On the surface of the packaging or mounting substrate 50, a print wiring 51 is formed of copper or the like and a packaging region 52 of the semiconductor devices 20 is set. On the packaging region 52, a plurality of semiconductor devices 20 are stacked and packaged. The plurality of semiconductor devices 20 may contain the same or different kinds of semiconductor chips C, respectively.

The layers of semiconductor devices 20 are electrically connected to one another by connecting the projection electrodes T of the layers of semiconductor devices 20 to one another through the through holes 27 in the substrates 21 thereof (refer to FIGS. 11(a) to 11(e) and FIG. 12). And the layers of semiconductor devices 20 are electrically connected to a circuit on the packaging substrate 50 by connecting the projection electrodes T of the lowest layer (the closest layer to the packaging substrate 50) of semiconductor device 20 to the print wiring 51 on the packaging substrate 50 through the through holes 27. The connection of the layers of semiconductor devices 20 to one another and the connection of the lowest layer of semiconductor device 20 to the print wiring 51 are achieved by melting the solder balls 28 through reflowing.

According to this embodiment, as mentioned above, a thin-type semiconductor package is realized by providing a semiconductor chip C and projection electrodes T on the same surface side of a substrate 21 and resin-sealing them. Therefore, it is not necessary to pull leads outward of the package, so that the occupied area on the packaging substrate 50 is reduced. Further, since the three-dimensional packaging or mounting of the semiconductor devices 20 is achieved by providing through holes 27 in the substrate 21, it is not necessary to individually bond leads of each layer of semiconductor device 20 to the packaging substrate, unlike the aforementioned conventional art. Accordingly, the three-dimensional packaging of the semiconductor devices 20 can be extremely simply achieved.

Further, the projection electrodes T, being surrounded by the protective resin 25 (insulator), are electrically stable without generating leak current or the like, and mechanically stable without being deformed or broken.

Further, by using the projection electrodes T, the wiring distance between the semiconductor chip C of an upper semiconductor device and a lower semiconductor chip C becomes short, and advantageously, highly speeding up of the electrical operation can be realized.

Figure 14:
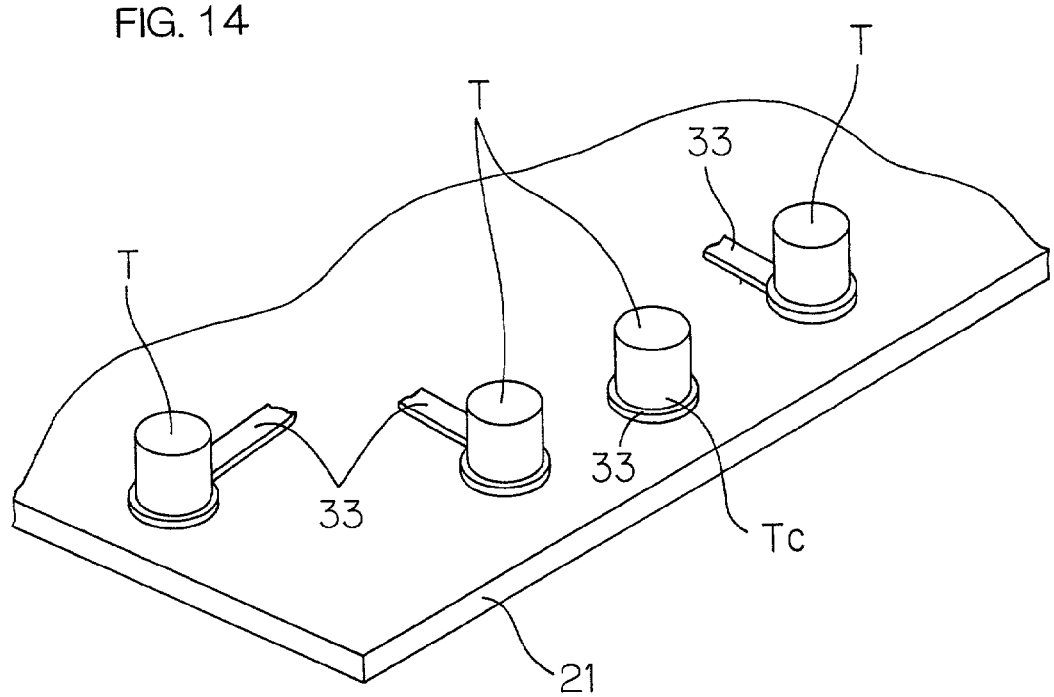
FIG. 14 is a perspective view showing the structure for connecting specified projection electrodes of a specified semiconductor device to a packaging substrate independently of other semiconductor devices.

When specified projection electrodes T of a specified semiconductor device 20 of the plurality of vertically stacked semiconductor devices 20 are desired to be independently connected to the packaging substrate 50, the structure shown in FIG. 14 can be adopted. That is, on the substrates 21 of the lower semiconductor devices 20 than the specified semiconductor device 20, independent (i.e. electrically unconnected to the semiconductor chips C of the lower semiconductor devices 20 than the specified semiconductor device 20) junction projection electrodes Tc are provided at the positions corresponding to the specified projection electrodes T. Thereby, the specified projection electrodes T of the specified semiconductor device 20 can be connected through the junction projection electrodes Tc to the packaging substrate 50 independently of other semiconductor devices 20.

Figure 15:
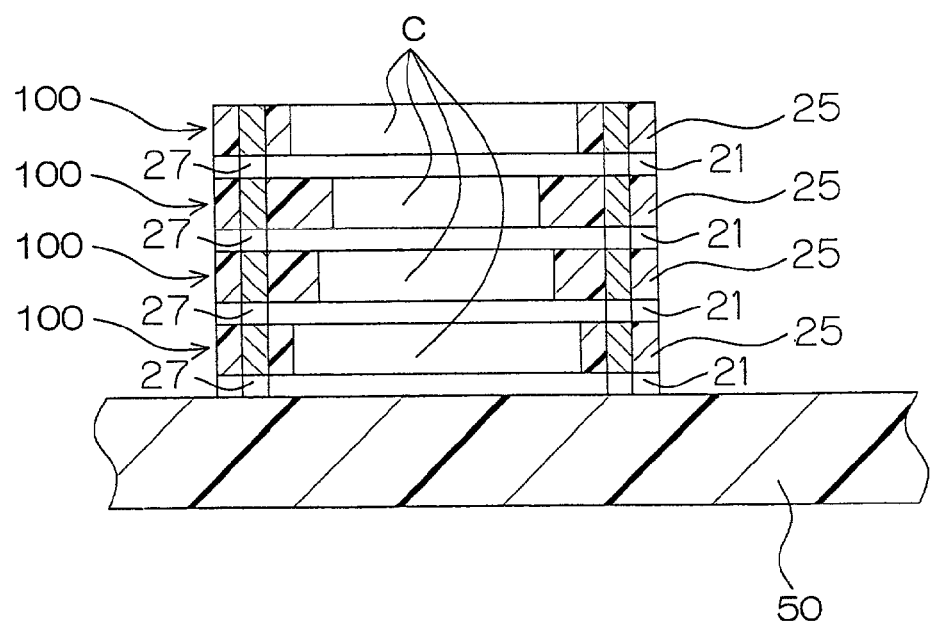
FIG. 15 is a sectional view showing three-dimensional packaging of semiconductor devices containing different-sized semiconductor chips.

In the above-mentioned description of this embodiment, a plurality of semiconductor devices 20 having the same size semiconductor chips C respectively are stacked and three-dimensionally packaged. However, by aligning projection electrodes T as shown in FIG. 15, a plurality of semiconductor devices 100 containing different-sized semiconductor chips c respectively can be three-dimensionally packaged similarly to the above-mentioned embodiment.

Further, in the abovementioned embodiment, the semiconductor devices 20, 100 are packaged or mounted face-up on the packaging substrate 50 with the semiconductor chips C thereof in the upward position. However, the semiconductor devices 20, 100 may be packaged or mounted face-down on the packaging substrate 50 with the semiconductor chips C thereof opposed to the packaging substrate 50.

Further, in the above-mentioned embodiment, the solder balls 28 are provided in the through holes 27 in the substrate 21. However, cream solders, instead of the solder balls 28, may be provided in the through holes 27 to be connected to the packaging substrate 50 or another layer of semiconductor device 20 by reflowing.

Figure 16:
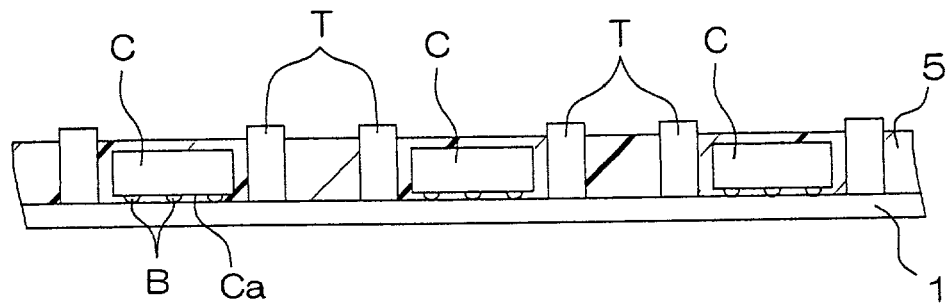
FIG. 16 is a sectional view showing the structure of a semiconductor device according to an eighth embodiment of the present invention.
Figure 17:
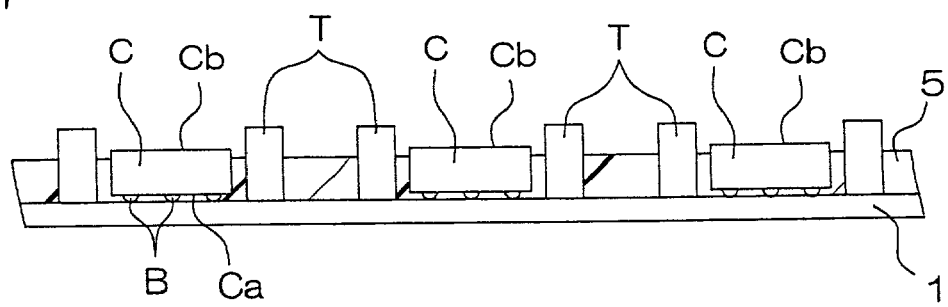
FIG. 17 is a sectional view showing the structure of a semiconductor device according to a ninth embodiment of the present invention.
Figure 18:
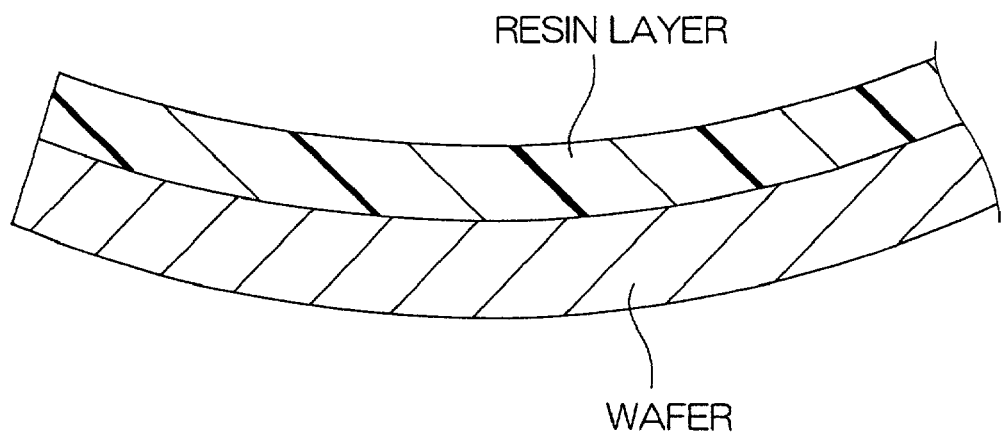
FIG. 18 is a schematic view explaining a problem of warping caused when a resin layer is formed only on the surface of a wafer.
Figure 19:
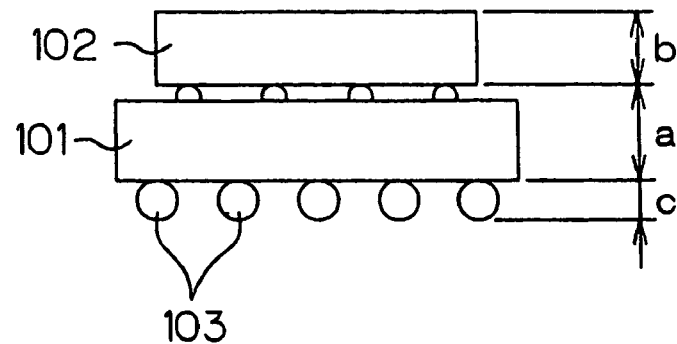
FIG. 19 is a schematic view explaining the structure of a conventional chip-on-chip type semiconductor device.
Figure 20:
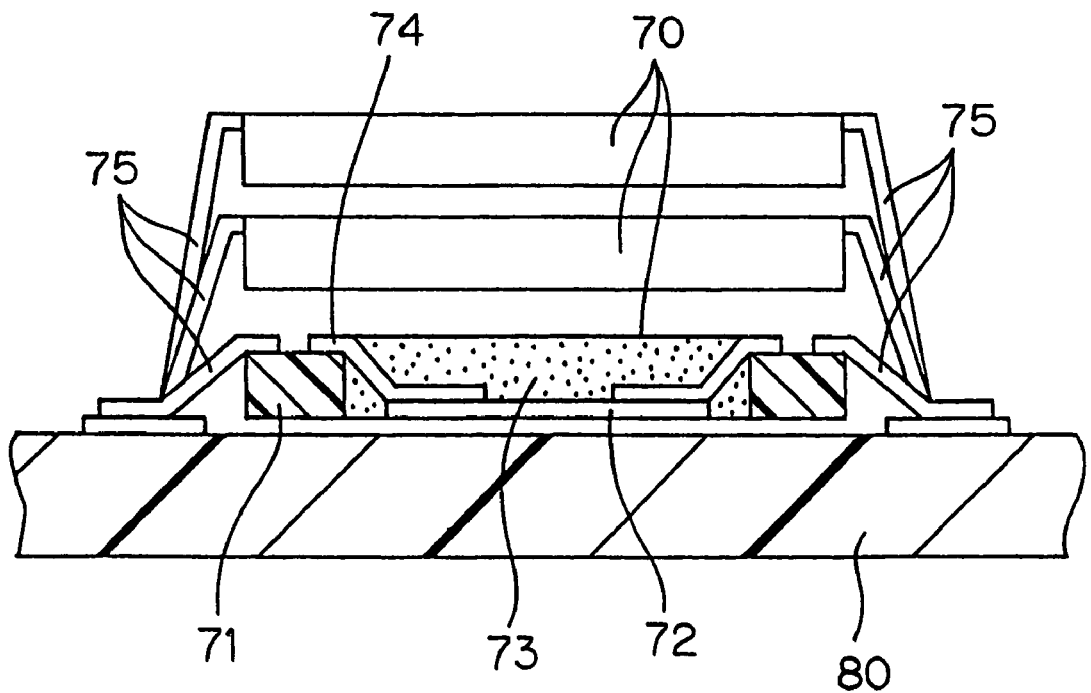
FIG. 20 is a sectional view showing an example of a three-dimensional packaging of a thin-type semiconductor device by a prior art.

Further, in the above-mentioned embodiment, the protective resin 25, the projection electrodes T and the inactive surface Cb of the semiconductor chip C are in the same plane. However, the head portions of the projection electrodes T may be protruded from the upper surface of the protective resin 25, as in the eighth embodiment shown in FIG. 16. Further, the inactive surface Cb side of the semiconductor chip C may be protruded from the upper surface of the protective resin 25, as in the ninth embodiment shown in FIG. 17. The structure shown in FIG. 16 or 17 can be fabricated by sufficiently thinning the protective resin 25. In this case, if the protective resin 25 tends to adhere to the head portions of the projection electrodes T, the protective resin adhered to the head portions of the projection electrodes T can be removed by polishing or grinding using a grinder or the like or etching.

Further, in the above-mentioned embodiment, one semiconductor chip C is bonded onto the substrate 21 to fabricate the semiconductor device 20,100. However, it is possible to bond two or more semiconductor chips C in common onto a substrate 21 so as to fabricate a semiconductor device 25 containing more than one semiconductor chip C.

Further, in the above-mentioned embodiment, the projection electrodes T are cylindrical, but they may be in the form of bumps.

Further, in the above-mentioned embodiment, in the manufacturing process, plurality of semiconductor chips C are resin-sealed as a whole, but every semiconductor chip C or every two or three (i.e. a predetermined plurality of) semiconductor chips C may be resin-sealed.

Further, in the above-mentioned each embodiment, mechanical grinding using a grinder is performed in the grinding step, but the grinding step may comprise a chemical grinding step using an etching liquid or a chemical and mechanical polishing step such as CMP (chemical and mechanical polishing) method. However, since the grinding speed is made more account of than the grinding precision in grinding or polishing the inactive surface side of the semiconductor chip C, the mechanical grinding method using a grinder is the most preferable among the above-mentioned three methods from a viewpoint of improving the manufacturing efficiency.

The resin and the inactive surface of the semiconductor chip mechanically ground by a grinder will have grinding traces thereon. However, such grinding traces can be cleaned at need by a chemical method such as etching or the like.

Further, in the above-mentioned embodiments, a dicing saw is used in the cutting out step for cutting out pieces of semiconductor devices. However, other cutting methods such as cutting with laser beam may be applied.

Although the present invention has been described and illustrated in detail, it is clearly understood that the same is by way of illustration and example only and is not to be taken by way of limitation, the spirit and scope of the present invention being limited only by the terms of the appended claims.

This application corresponds to the Japanese Patent Applications No.11-235619 and No.11-235620 filed in the Japan Patent Office on Aug. 23, 1999, No.11-257589 filed in the Japan Patent Office filed on Sep. 10, 1999 and No. 11-292703 filed in the Japan Patent Office on Oct. 14, 1999, the whole disclosures of these applications being incorporated herein by reference.

What is claimed is:

1. A method for manufacturing a semiconductor device, comprising:
   a step of forming projection electrodes on a surface at a front side of a semiconductor substrate,
   after said step of forming projection electrodes, a step of forming a surface resin layer on the surface of the semiconductor substrate,
   a step of forming a back side resin layer on a back side of the semiconductor substrate so that the surface resin layer and the back side resin layer have substantially the same thickness respectively,
   a surface grinding step of exposing the projection electrodes from the surface resin layer by polishing or grinding the surface resin layer,
   bracing the substrate with the back side resin layer until after the surface grinding step, and
   after said surface grinding step, a back side grinding step of thinning the semiconductor substrate by removing the back side resin layer, through polishing or grinding, from the semiconductor substrate provided with the surface resin layer and the back side resin layer, and by further polishing or grinding the back side of the semiconductor substrate from which the back side resin layer has been removed.

2. A method for manufacturing a semiconductor device as claimed in claim 1, further comprising a cutting out step of cutting out pieces of semiconductor devices by cutting the semiconductor substrate along cutting lines after completing the back side grinding step.

3. A method for manufacturing a semiconductor device as claimed in claim 1, in which the surface resin layer is formed in such a manner that the projection electrodes are embedded in the surface resin layer.

4. A method for manufacturing a semiconductor device as claimed in claim 1, further comprising a cutting out step of cutting out pieces of semiconductor devices by cutting the semiconductor substrate along cutting lines after completing the back side grinding step, wherein the surface grinding step includes exposing the projection electrodes from the surface resin layer by polishing or grinding the surface resin layer such that the remaining surface layer has a thickness that is uniform at least within the cutting lines defining the individual pieces cut out of semiconductor devices in the cutting out step.

5. A method for manufacturing a semiconductor device as claimed in claim 1, wherein said step of forming a surface resin layer includes forming the surface layer with uniform thickness.

6. A method for manufacturing a semiconductor device as claimed in claim 1, wherein the surface grinding step includes grinding the surface resin layer so that the heights of the plurality of projection electrodes are uniform.

7. A method for manufacturing a semiconductor device, comprising:
   a chip bonding step of bonding a plurality of semiconductor chips face-down onto a surface of a semiconductor substrate with active surfaces of the semiconductor chips opposed to the surface of the semiconductor substrate, in such a manner that the plurality of semiconductor chips and substrate define chip-on-chip structures, an electrode forming step of forming a plurality of projection electrodes on the surface of the semiconductor substrate, including forming each of the projection electrodes with a height such that the top end each projection electrode is between the height of the active surface of the semiconductor chips and a height of an inactive surface of the semiconductor chips, a resin sealing step of sealing, with a protective resin, the semiconductor chips and the exposed surface of the semiconductor substrate after forming the projection electrodes in such a manner that head portions of the projection electrodes are exposed, and a cutting out step of taking out individual pieces of chip-on-chip type semiconductor devices by cutting the semiconductor substrate along predetermined cutting lines.

8. A method for manufacturing a semiconductor device as claimed in claim 7, in which the resin sealing step includes an electrode exposing step of exposing the head portions of the projection electrodes by removing a surface layer section of the protective resin.

9. A method for manufacturing a semiconductor device as claimed in claim 8, in which the electrode exposing step includes a chip grinding step of simultaneously polishing or grinding the protective resin and an inactive surface side of the semiconductor chips.

10. A method for manufacturing a semiconductor device as claimed in claim 7, in which a back side of the semiconductor substrate or an inactive surface side of the semiconductor chips is polished or ground before the cutting out step.

11. A method for manufacturing a semiconductor device as claimed in claim 7, wherein the semiconductor substrate includes a semiconductor wafer and the method is performed a wafer level basis.

* * * * *